United States Patent
Zeng et al.

(10) Patent No.: US 8,319,278 B1
(45) Date of Patent: Nov. 27, 2012

(54) POWER DEVICE STRUCTURES AND METHODS USING EMPTY SPACE ZONES

(75) Inventors: Jun Zeng, Torrance, CA (US); Mohamed N. Darwish, Campbell, CA (US); Richard A. Blanchard, Los Altos, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 19 days.

(21) Appl. No.: 12/720,856

(22) Filed: Mar. 10, 2010

Related U.S. Application Data

(60) Provisional application No. 61/165,175, filed on Mar. 31, 2009, provisional application No. 61/259,069, filed on Nov. 6, 2009.

(51) Int. Cl.
*H01L 29/66* (2006.01)
(52) U.S. Cl. .. 257/330; 257/340; 257/341; 257/E29.255
(58) Field of Classification Search ............... 257/340, 257/341, E29.255, 330
See application file for complete search history.

(56) References Cited

U.S. PATENT DOCUMENTS

| | | | |
|---|---|---|---|
| 5,198,385 A | 3/1993 | Devitt et al. | |
| 5,282,018 A | 1/1994 | Hiraki et al. | |
| 5,308,440 A | 5/1994 | Chino et al. | |
| 5,637,898 A | 6/1997 | Baliga | |
| 5,708,303 A | 1/1998 | Jeng | |
| 5,759,913 A | 6/1998 | Fulford, Jr. et al. | |
| 5,864,159 A | 1/1999 | Takahashi | |
| 5,880,026 A | 3/1999 | Xing et al. | |
| 5,973,359 A | 10/1999 | Kobayashi | |
| 5,998,833 A | 12/1999 | Baliga | |
| 6,069,372 A | 5/2000 | Uenishi | |
| 6,114,727 A | 9/2000 | Ogura et al. | |
| 6,127,285 A | 10/2000 | Nag | |
| 6,191,447 B1 | 2/2001 | Baliga | |
| 6,204,200 B1 | 3/2001 | Shieh et al. | |
| 6,251,730 B1 | 6/2001 | Luo | |
| 6,388,286 B1 | 5/2002 | Baliga | |
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 2001/0041407 A1 | 11/2001 | Brown | |
| 2003/0203576 A1 | 10/2003 | Kitada et al. | |
| 2006/0060916 A1 | 3/2006 | Girdhar et al. | |
| 2008/0160705 A1* | 7/2008 | Disney ........................ 438/283 |
| 2008/0164518 A1 | 7/2008 | Darwish | |
| 2011/0147835 A1* | 6/2011 | Radic et al. ................ 257/333 |

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.

(Continued)

*Primary Examiner* — Matthew Landau
*Assistant Examiner* — Colleen E Snow
(74) *Attorney, Agent, or Firm* — Robert O. Groover, III; Groover & Associates, PLLC

(57) ABSTRACT

Power semiconductor devices in which insulated empty space zones are used for field-shaping regions, in place of dielectric bodies previously used. Optionally permanent charge is added at the interface between the insulated empty space zone and an adjacent semiconductor drift region.

18 Claims, 47 Drawing Sheets

OTHER PUBLICATIONS

J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

* cited by examiner

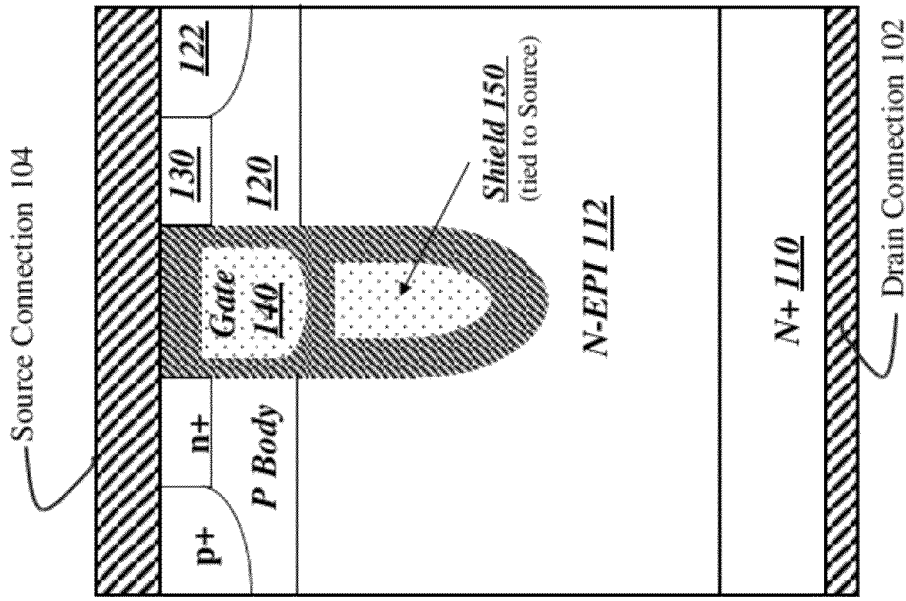
*Figure 1(b): Prior Art*
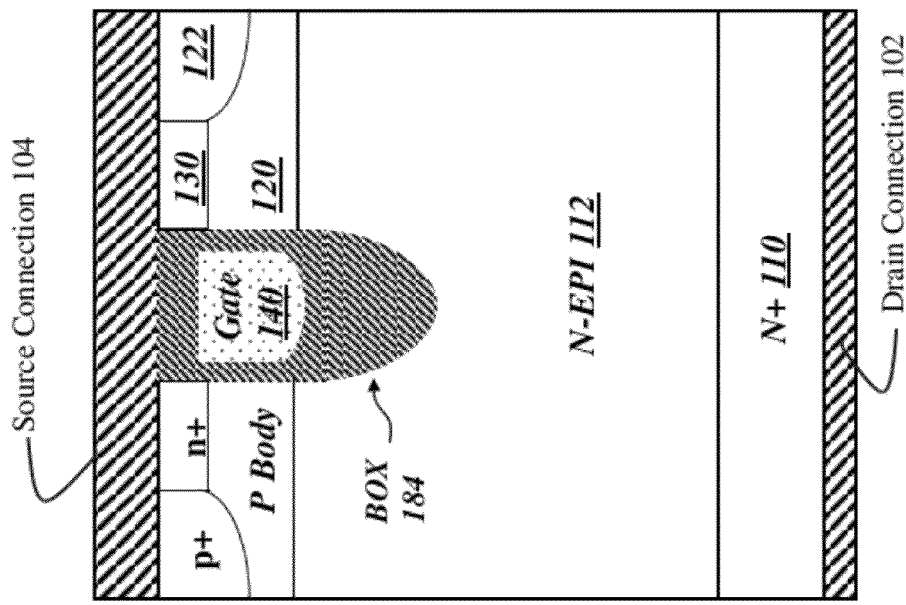
*Fig. 1(a): Prior Art*

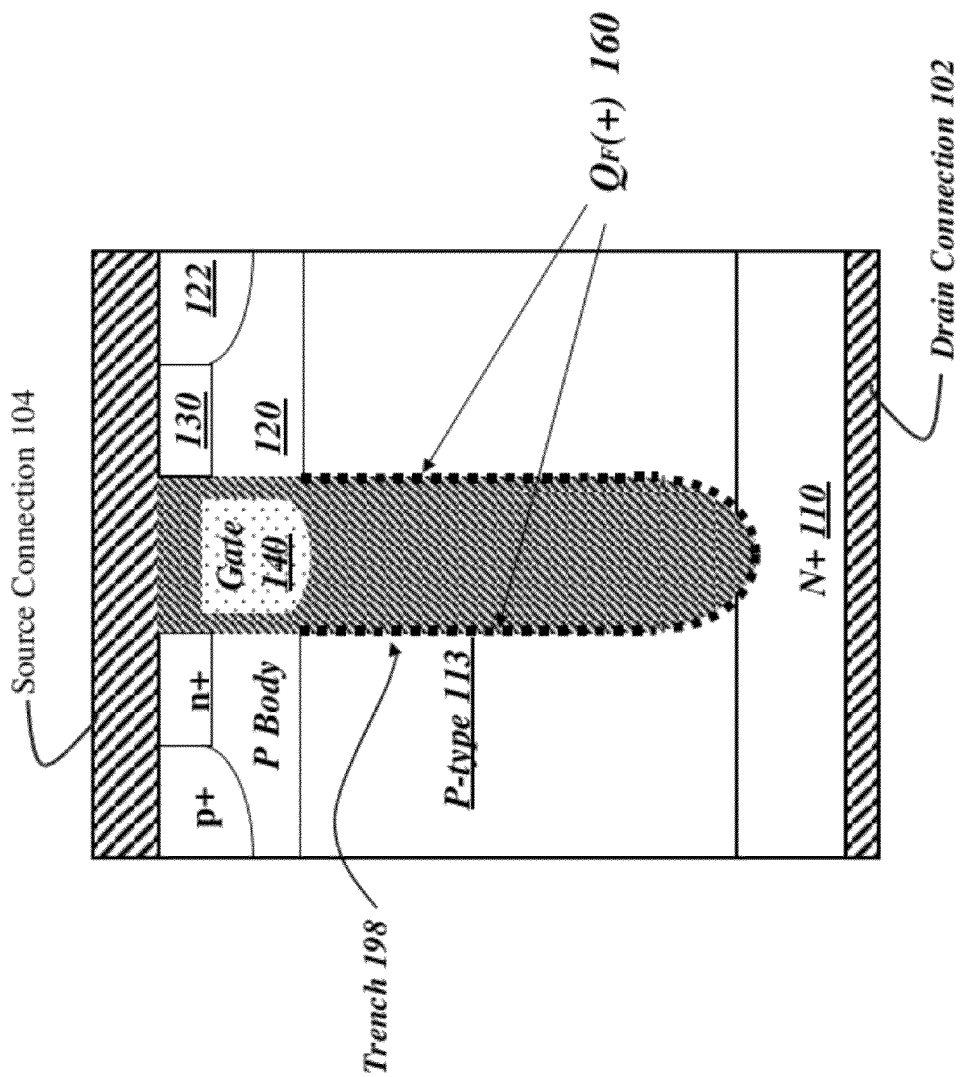
*Figure 1(c): Prior Art*

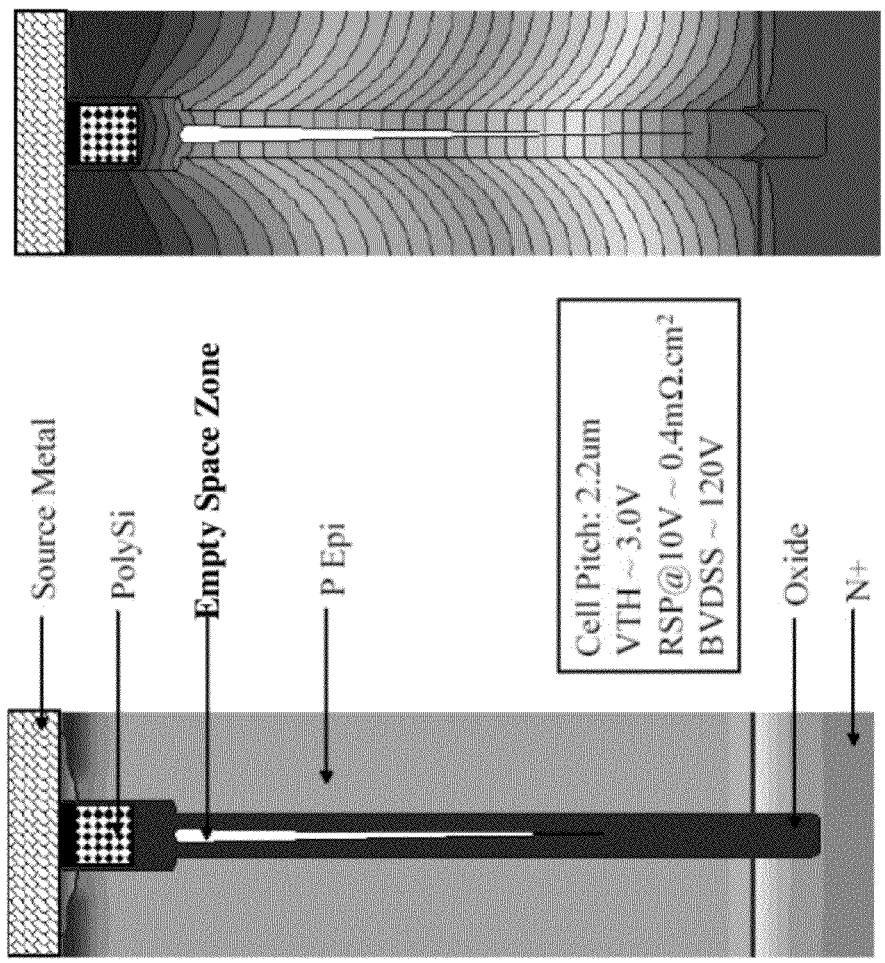

POWER DEVICE STRUCTURES AND METHODS USING EMPTY SPACE ZONES

CROSS-REFERENCE

Priority is claimed from U.S. applications 61/165,175 filed 31 Mar. 2009 and 61/259,069 filed 6 Nov. 2009, both of which are hereby incorporated by reference.

BACKGROUND

The present application relates to power devices which include trenches having empty space zones therein, to methods for making such devices, and to other related methods.

Note that the points discussed below may reflect the hindsight gained from the disclosed inventions, and are not necessarily admitted to be prior art.

Power MOSFETs are widely used as switching devices in many electronic applications. In order to minimize the conduction power loss it is desirable that power MOSFETs have a low specific on-resistance ($R_{SP}$ or R*A), which is defined as the product of the on-resistance of the MOSFET multiplied by the active die area. In general, the on-resistance of a power MOSFET is dominated by the channel and drift region resistances.

The most common way to reduce the $R_{SP}$ is to shrink the device's unit cell pitch and increase the packing density or number of cells per unit area. However, as the cell density increases, the associated intrinsic capacitances of device, such as the gate-to-source capacitance (Cgs), the gate-to-drain capacitance (Cgd), the total input capacitance (Ciss) and the total output capacitance (Coss), also increase. In consequence, the switching power loss of device will increase which is undesirable. In many switching regulation applications such as synchronous buck dc-dc converters used in mobile products, MOSFETs are required to operate at high switching frequencies approaching the range of 1 MHz. Therefore, it is desirable to minimize the total switching or dynamic power loss governed by these capacitances.

Currently, there are two common techniques to improve the switching performance of power MOSFETs. The first one is the trench-gated MOSFET with thick bottom oxide (BOX), as shown in FIG. 1(a) (taken from U.S. patent application Ser. No. 12/431,852). In the structure of this Figure, a gate electrode 140 (typically polysilicon) is positioned inside a trench, and capacitively coupled to the adjacent p-type body region 120. When the gate 140 is at a sufficiently positive voltage, the nearest part of the body region 120 will be inverted to form a channel, so that conduction is possible. Specifically, electrons will pass from n+ source 130, through the vertical channel, into the drift region 112, and down to the n+ drain diffusion 110. A backside connection 102 makes contact to the drain diffusion 110, and a frontside connection 104 makes contact to the source diffusion 130. The frontside connection 104 also makes contact to a p+ body contact diffusion 122, and therethrough to body diffusion 120. The thick bottom oxide 184 helps to decouple the gate from the drain.

The second common approach is the split poly gated MOSFET structure, in which a bottom poly region 150, connected to the source electrode, lies below the gate. An example of this, along the lines of U.S. Pat. No. 5,998,833 and/or U.S. Pat. No. 6,683,346, is shown in FIG. 1(b). This bottom region 150 may be referred to as a shield plate, since it improves shielding between the drain and the gate, and hence reduces the Miller charge.

In the first technique, the gate-to-drain capacitance, Cgd, is dependent on the trench width, BOX thickness and the dielectric constant of BOX layer. Narrower trench and thicker BOX are required in order to achieve a very low Qgd number. Unfortunately, a narrow trench will put a limitation on the maximum BOX thickness used in this structure without incompletely filling of the trench bottom.

The resistance of the drift region is also a significant concern in power MOSFETs. One approach to reducing the drift region resistance uses the so called superjunction structure. A superjunction device is constructed by paralleling relatively highly doped p-type and n-type layers or pillars in an alternating pattern. The doping concentrations of the n-type pillar (the n-type drift region), for the same breakdown voltage, can be significantly higher than that of a conventional drift region, as long as the total charge of the n-type pillar is balanced with the charge in the p-type pillar. In order to fully realize the merit of the superjunction, it is desirable to pack many pillars in a given area to achieve a lower specific on-resistance $R_{SP}$. However, the minimum achievable widths, in device manufacturing, of the n-type and p-type pillars set a limitation on the reducing the cell pitch and scaling the device.

A recently published application (US application 20080164518), as shown in FIG. 1(c), has addressed this issue by incorporating permanent positive charges ($Q_F$) in trenches filled with dielectric material such as silicon oxide. The permanent charge also forms an electrically induced drift region by creating an inversion layer between the oxide and the P layer. By making use of this new concept, the scaling limitation due to inter-diffusion of p-type pillar and n-type pillar can be significantly reduced. Consequently, a small cell pitch and high packing density of pillars, as well as a large channel cross-section (for a given total surface area) can be realized. This reduces the device's total on resistance and its $R_{SP}$.

In the MOSFET structure shown in FIG. 1(c), the breakdown voltage is proportional to the trench depth and its $R_{SP}$ is proportional to the cell pitch. As the trench depth increases and cell pitch reduces, the trench becomes deep and narrow. As the trench depth to width aspect ratio increases it becomes more difficult to completely fill it with dielectric material, and manufacturing the device becomes a problem. Furthermore, a void may exist in the trench that precludes forming a gate electrode within the trench, since it cannot be reliably reproduced.

Some of the present inventors have previously proposed power devices which include dielectric-lined trenches with empty space zones, as in PCT application WO2008086348. In this application, note that FIG. 2B shows a void in the charge control trenches, and the accompanying description mentions the possibility of multiple voids. FIGS. 43B, 43C, and 43D of this earlier application all show voids in a trench below a predominantly planar gate (but note that gate sags into trench a little). FIGS. 2B, 38N, 44L, and 45L of this earlier application each show devices with a void in the Recessed Field Plate trenches, but not in the gate trenches. This earlier application, and all of its priority applications, are hereby incorporated by reference. That application is commonly owned with the present application, and Applicants reserve the right to claim priority from that application in all countries where such priority is available.

SUMMARY

The present application discloses new approaches to power devices, in which one or more insulated empty space zones are included in proximity to semiconductor regions, particularly drift regions. Such insulated empty space zones are added into a wide variety of device structures, and provide reduced parasitic capacitance while shaping off-state potential contours and/or on-state carrier densities. Combined structures, partial structures, and methods of fabrication and methods of use are also described.

In one class of embodiments, intentionally introduced permanent charge is included near the interface between one or more of the insulated empty space zone zones and a semiconductor drift region.

The disclosed innovations, in various embodiments, provide one or more of at least the following advantages. However, not all of these advantages result from every one of the innovations disclosed, and this list of advantages does not limit the various claimed inventions.

Reduced parasitic capacitance;
Reduced Miller capacitance;
Reduced Miller charge;
Faster switching,
Reduced switching losses; and
Ease of fabrication.

BRIEF DESCRIPTION OF THE DRAWINGS

The disclosed inventions will be described with reference to the accompanying drawings, which show important sample embodiments of the application and which are incorporated in the specification hereof by reference, wherein:

FIGS. 1(a), 1(b), and 1(c) show various conventional devices, which help to understand the innovations shown in the other drawings.

FIGS. 30 and 31 show simulation results for devices like those in FIGS. 24(a)-26(b).

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally. Moreover, some statements herein may be true of some classes of embodiments but not others.

In one class of devices disclosed in this application, a controllable empty space zone is introduced into the BOX area, e.g. along the lines suggested in FIGS. 2(a) through 2(e). In these new structures, because the dielectric constant of the empty space zone is only about 1.0 compared to 3.9 of BOX oxide, the capacitance Cgd of the new structure can be reduced (desirably).

Figure 2A:
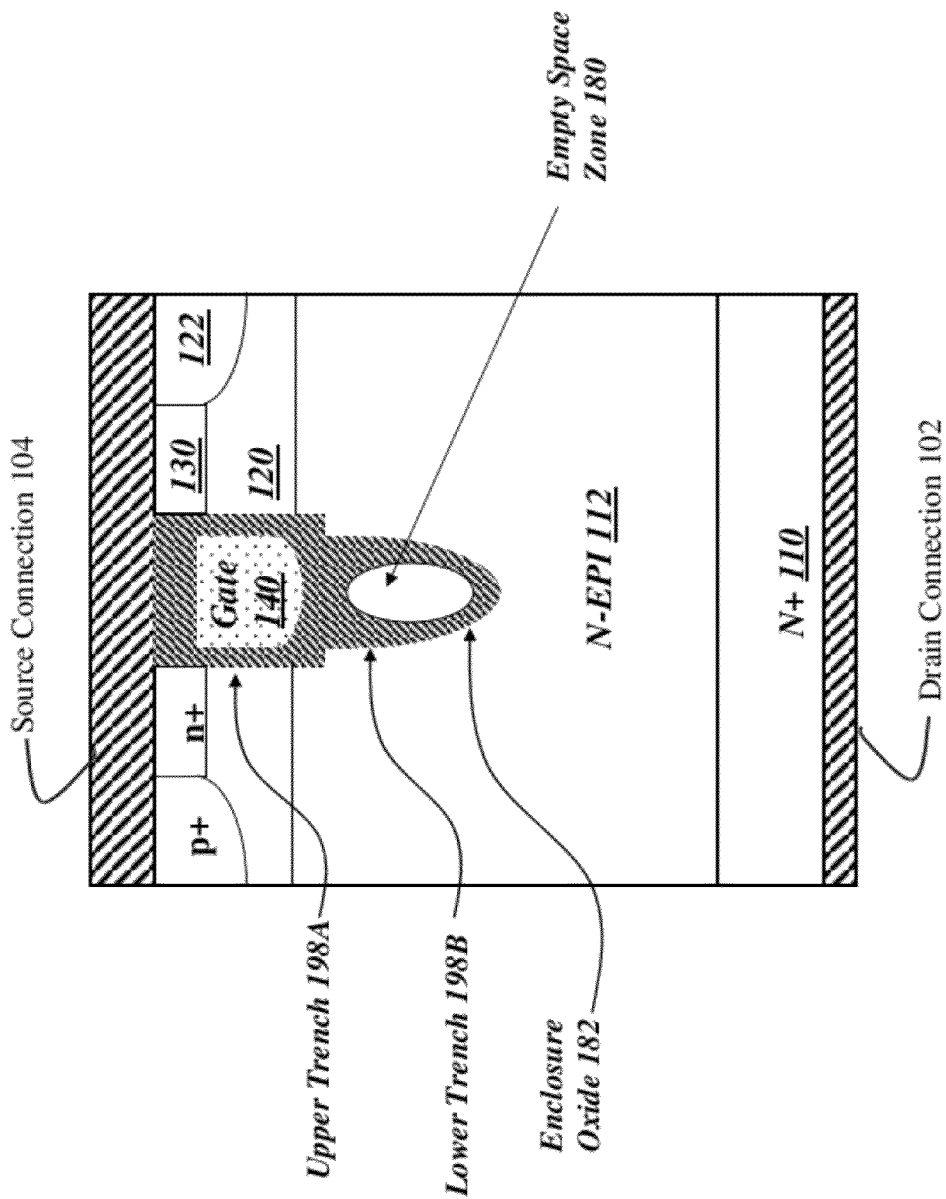
FIGS. 2(a) through 2(e) show a new class of devices, wherein an insulated empty space zone helps reduce parasitic capacitance.

In FIG. 2(a), the bottom oxide 184 of FIG. 1(a) is replaced by an empty space zone 180 surrounded by an enclosure oxide 182. This reduces the parasitic capacitance seen by the carrier trajectories, in the drift zone 112, that pass close to the trench.

Another important feature of FIG. 2(a) is that the upper trench 198A is wider than the lower trench 198B. This has important advantages in device fabrication particularly in trench filling with dielectric. In this example, the gate 140 lies entirely within the upper trench portion 198A, and the empty space zone 180 lies entirely within the lower trench portion 198B.

Figure 2B:
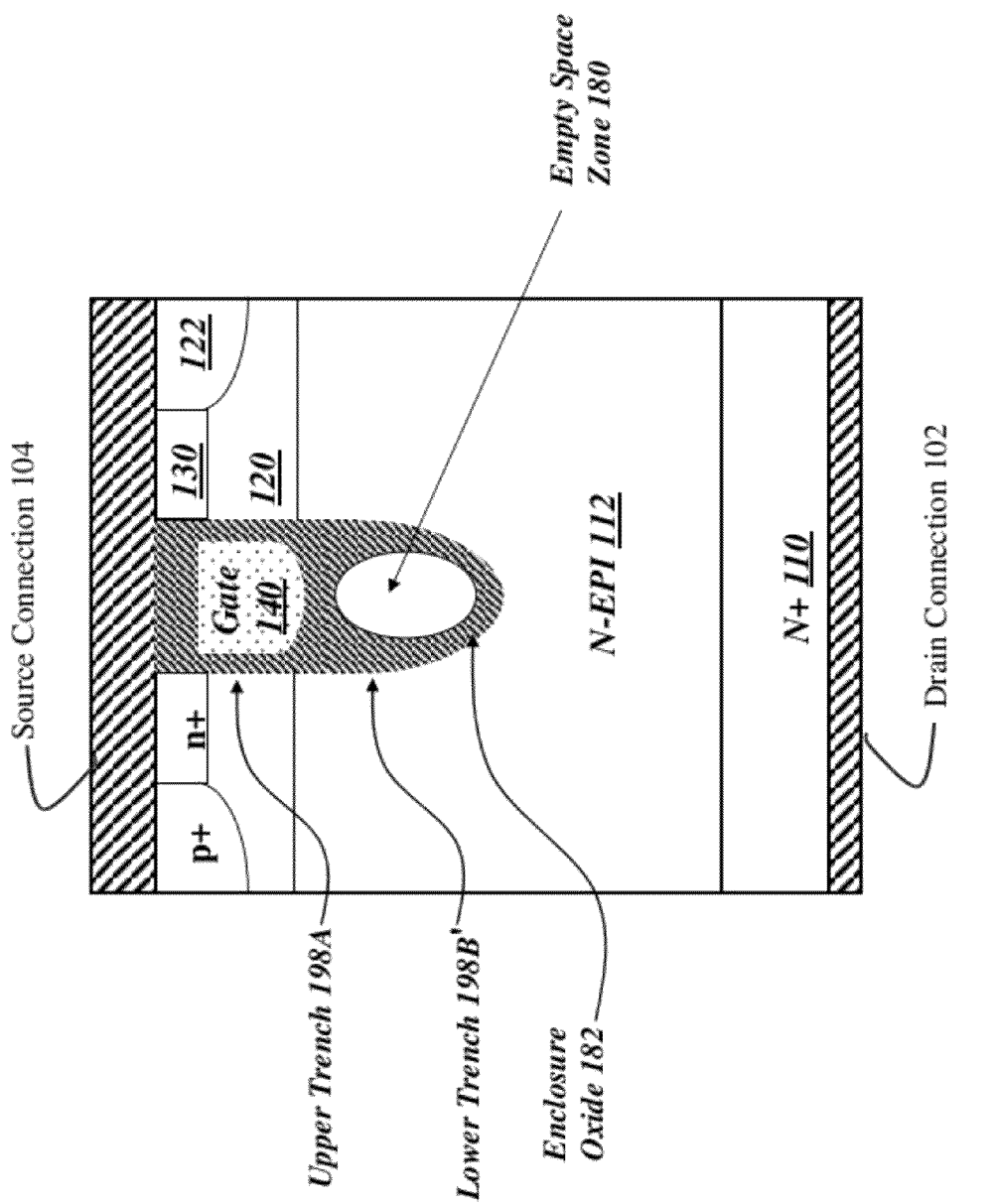

FIG. 2(b) shows an example of another class of device embodiments, where the lower trench 198W is fabricated with the same width as the upper trench 198A. This embodiment does not have the same synergistic advantages of device fabrication, but still provides reduced parasitic capacitance due to the use of empty space zone 180. The devices of this Figure are generally similar to those of FIG. 2(a) otherwise.

Figure 2C:
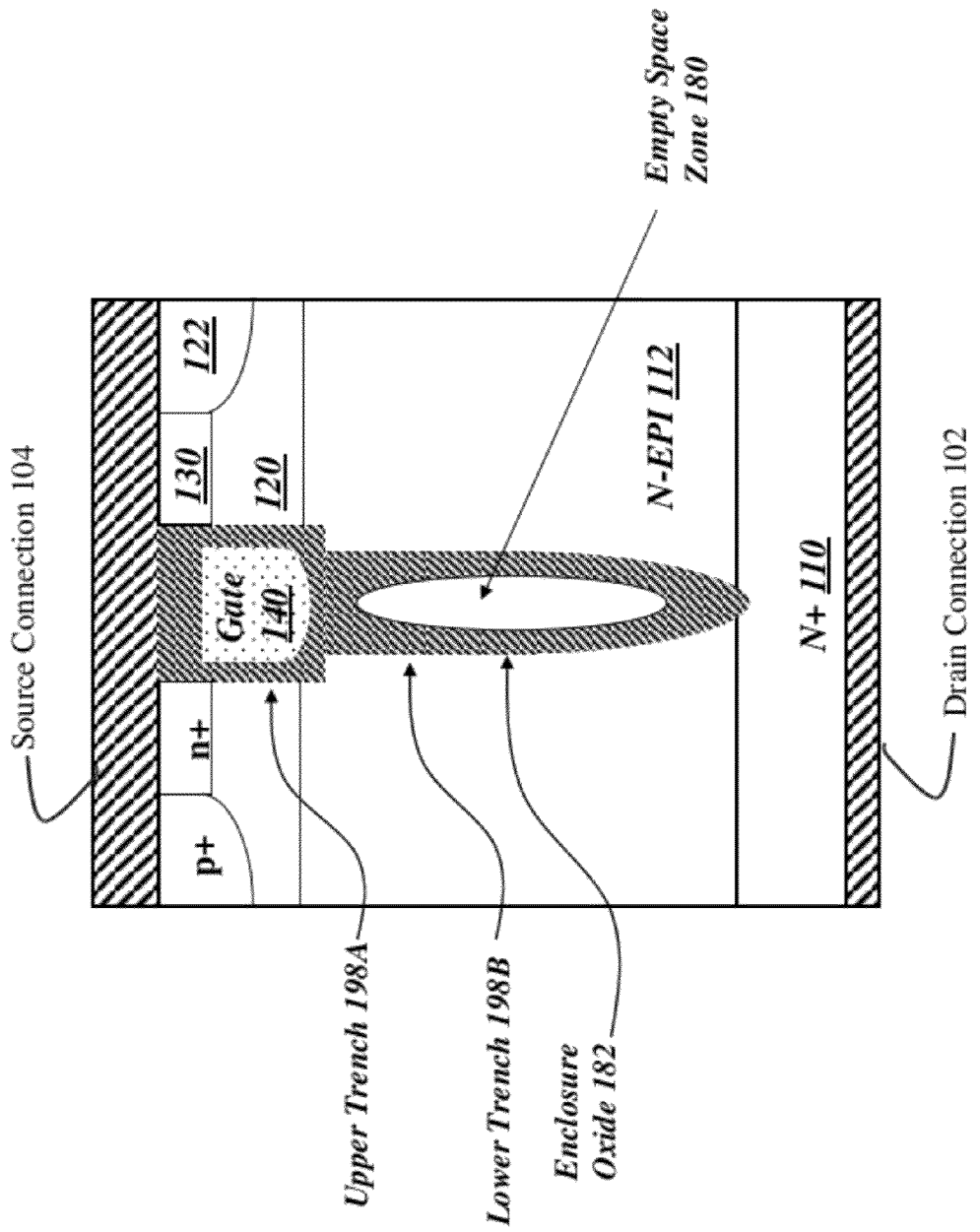

In FIG. 2(c), a different geometry is used for the lower trench 198B, and for its enclosure oxide 182 and empty space zone 180. In this example, the lower trench 198B is made deep enough to extend down all the way through the drift region 112 to the heavily doped substrate 110. (Alternatively, the trench depth can made slightly less in other embodiments, so that it extends almost to but not into the n+ region 110. The devices of this Figure are generally similar to those of FIG. 2(a) otherwise.

Figure 2D:
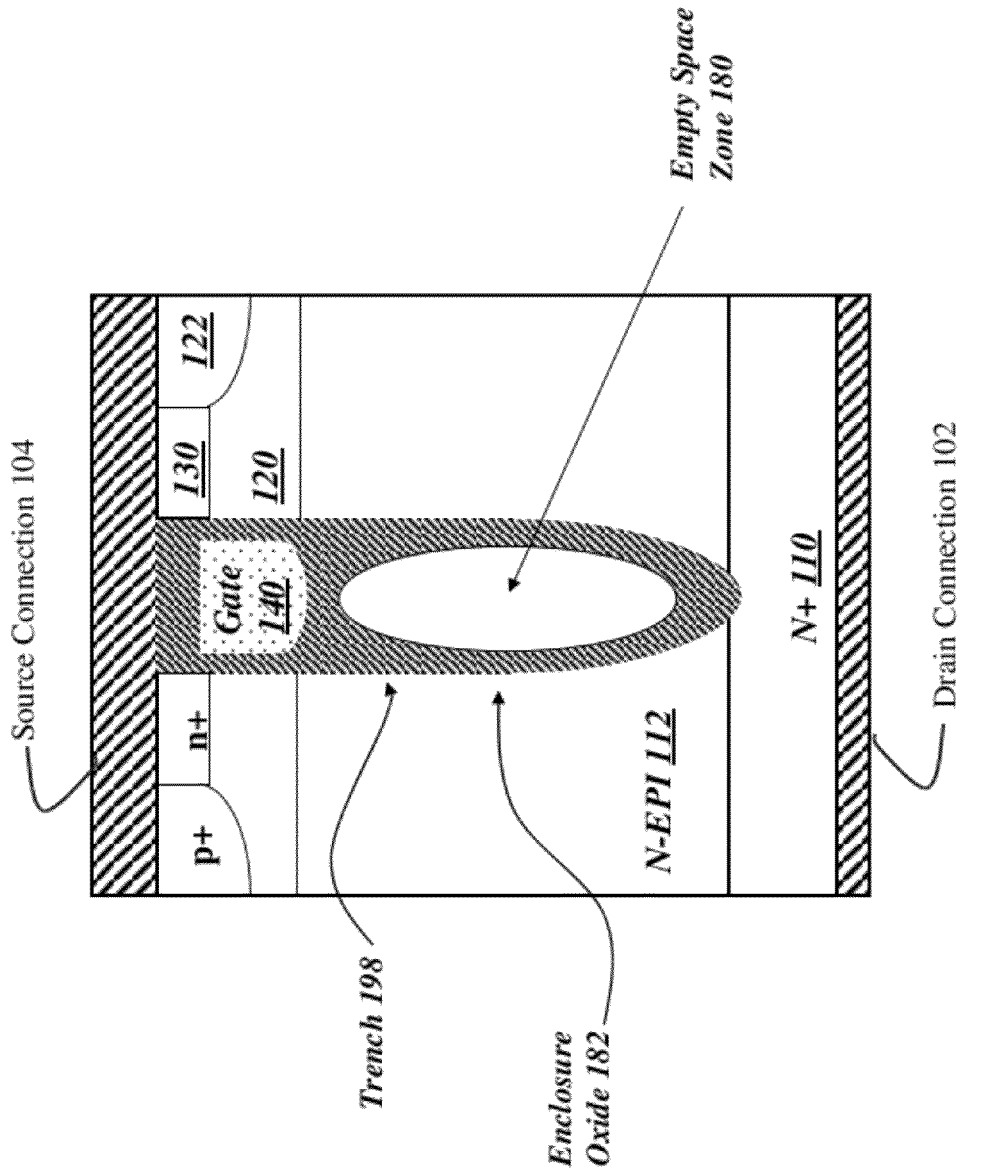

FIG. 2(d) combines features of the embodiments of FIGS. 2(b) and 2(c). The devices of this Figure are generally similar to those of FIG. 2(a) otherwise.

Figure 2E:
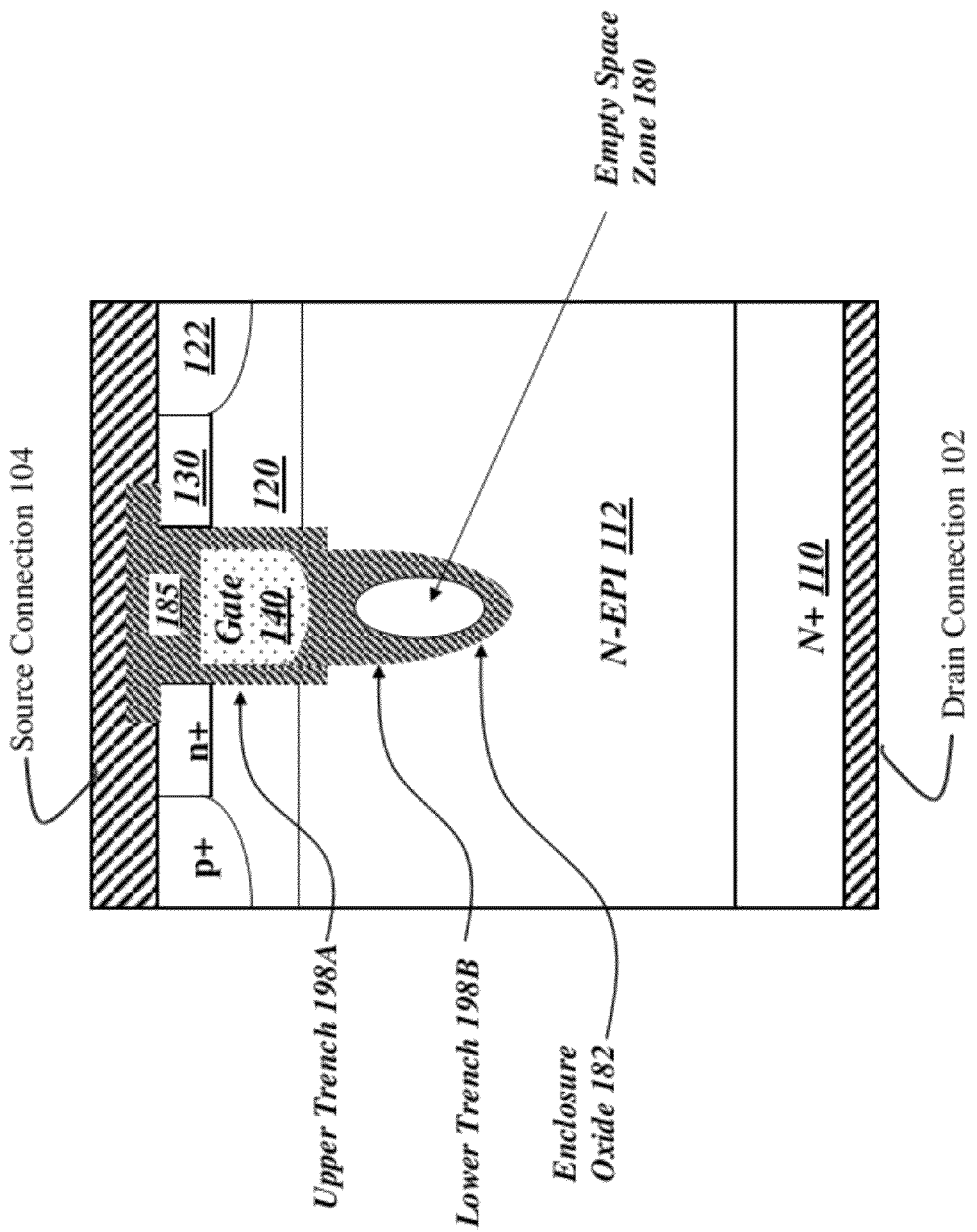

FIG. 2(e) is generally similar to FIG. 2(b), except that part of the trench fill oxide 185 has been allowed to remain above the top of the trench in a "nailhead" shape. This provides lateral offset between the location of the source contact (i.e. where metallization 104 contacts the source diffusion 130) and the device channel.

A particular advantage, from the fabrication process point view, is that a narrow trench is preferred for forming a empty space zone in the trench bottom area. This turns the disadvantageous limitation on the trench width, according to conventional understanding, into a benefit.

As discussed above, the introduction of a bottom poly as a shield plate 150 shields the poly gate from the drain, so that the gate-to-drain capacitance Cgd is reduced.

In another class of embodiments, an empty space zone 180 is added underneath the bottom poly layer of a conventional structure like that in FIG. 1(b). Because of its low dielectric constant, the Cgd is advantageously lowered. This is illustrated in FIG. 3.

In yet another class of embodiments, the Cgs can also be further reduced by placing another empty space zone 180 between the gate poly layer 140 and the bottom poly layer 150. This is displayed in FIG. 4.

Figure 3:
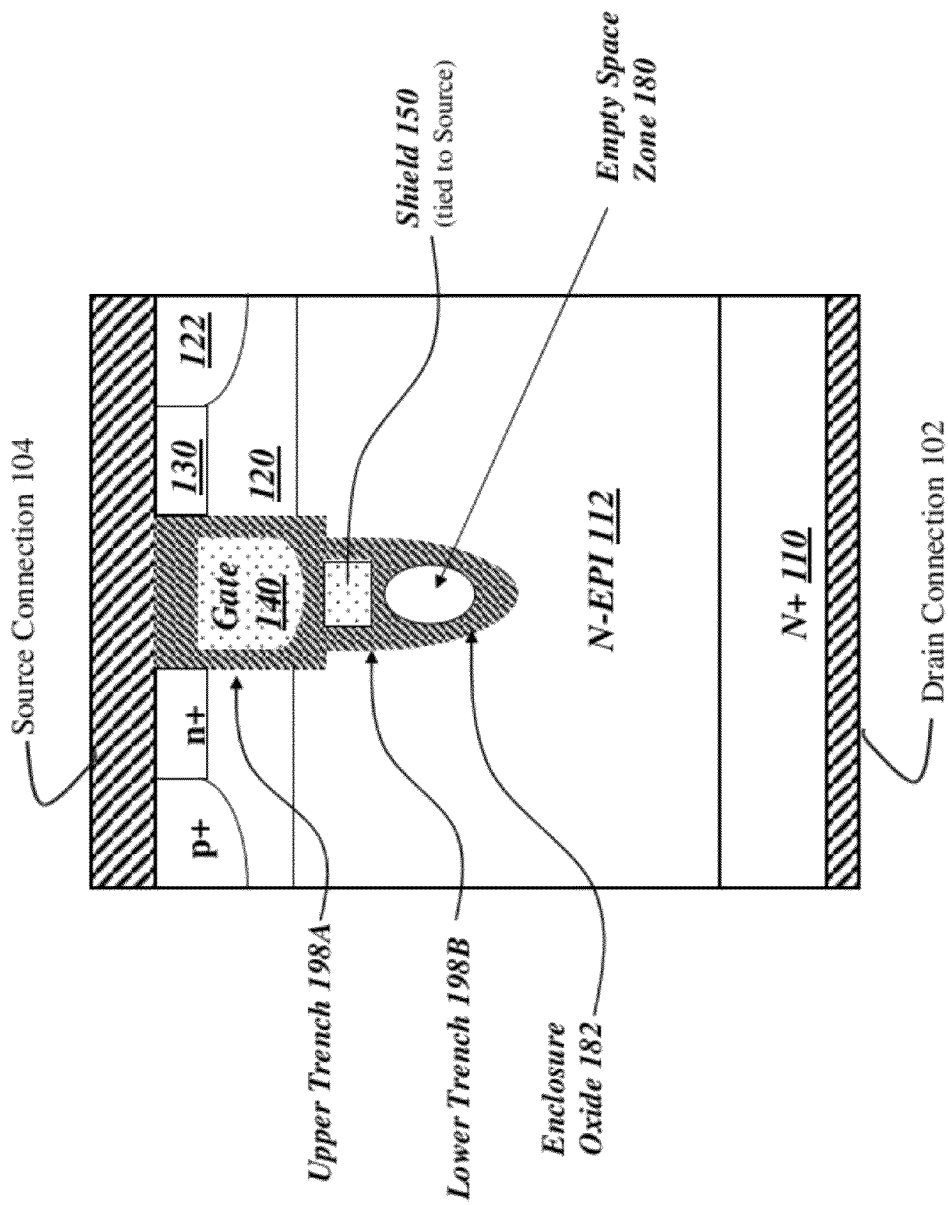
FIGS. 3, 4, and 5 show various examples of devices which include both an insulated empty space zone and also a shield electrode in the same trench with a gate electrode.
Figure 4:
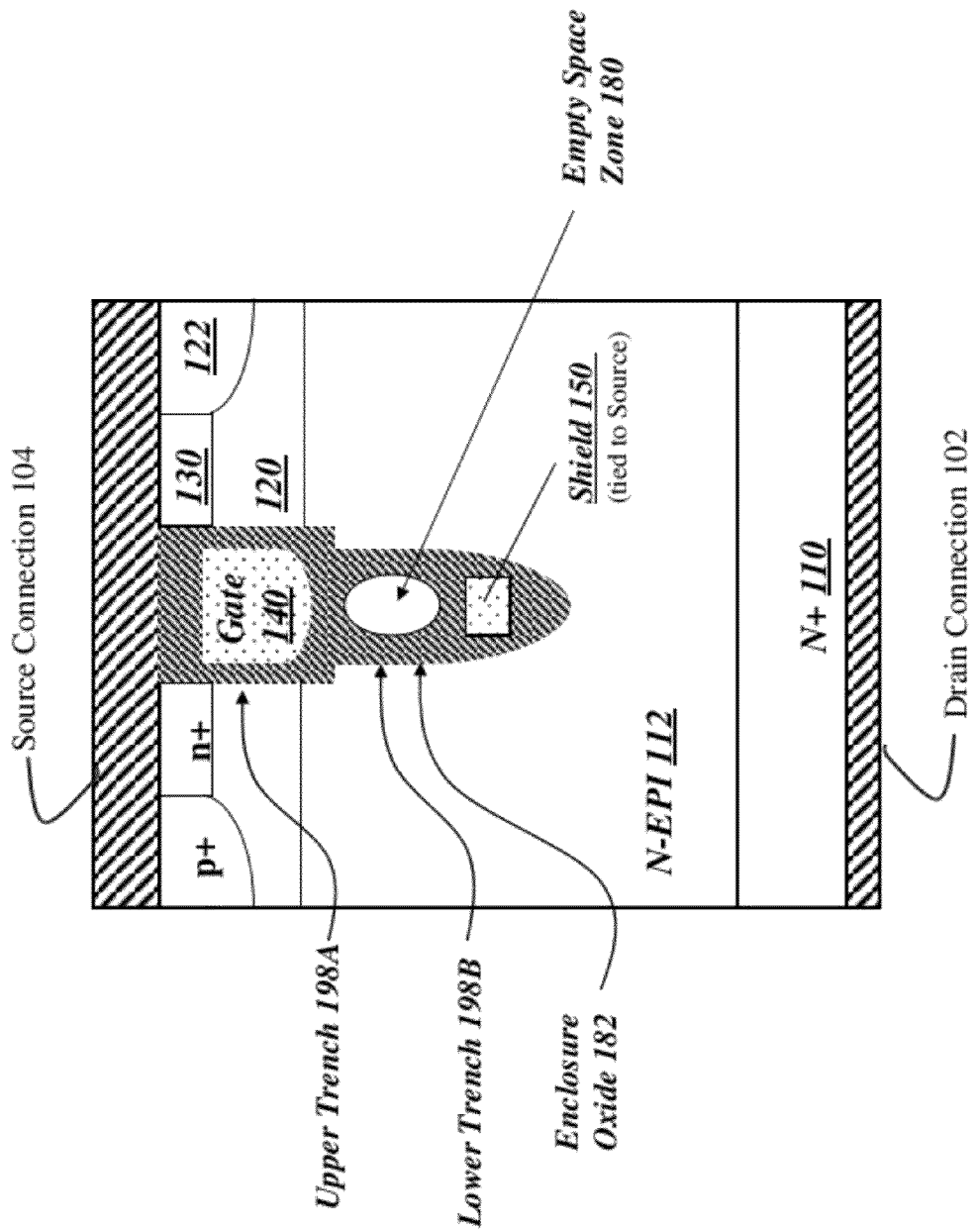
Figure 5:
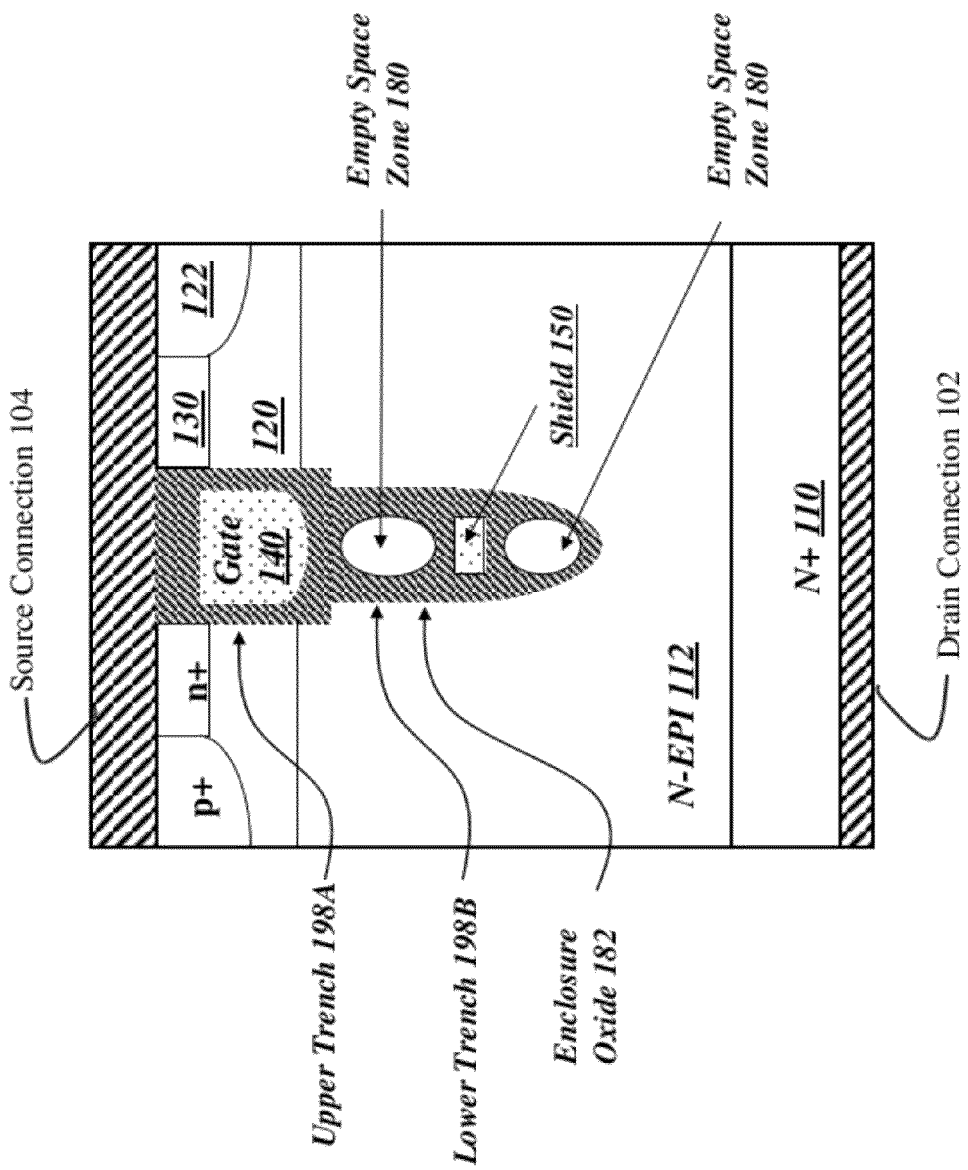

In yet another class of embodiments, by combining the empty space zones of FIGS. 3 and 4, two empty space zones 180 can be utilized to trim down both Cgs and Cgd at the same time. This implementation is shown in FIG. 5.

Two dimensional simulations on the full process and device characteristics have been performed for confirming the validity of the concepts described above. The simulation results are summarized in FIG. 6 and table I:

TABLE I

| DEVICE | VTH (V) | RSP @ 10V (mΩ · cm2) | BVDSS (V) | CGD (pF/cm2) |
|---|---|---|---|---|
| BOX | 1.76 | 0.147 | 43 | 1376 |
| E. S. Z. | 1.78 | 0.147 | 43.8 | 650 |

(VDD = 10 V, f = 1 MHz)

Table I shows the results of a comparative simulation comparing the parasitic capacitances of a device like that of FIG. 1(*a*) (BOX) with an example of a device as in FIG. 2(*a*) (E.S.Z). For this comparison, devices with very similar device parameters were used (similar threshold voltage, specific on-resistance, and breakdown voltage). In order to estimate the parasitic gate-drain capacitance, a supply voltage of 10V and a switching frequency of 1 MHz were assumed. The results summarized above show that gate-drain capacitance was reduced by MORE THAN HALF. This is a major change, which can translate directly into reduced switching losses and reduced system power consumption.

Figure 6:
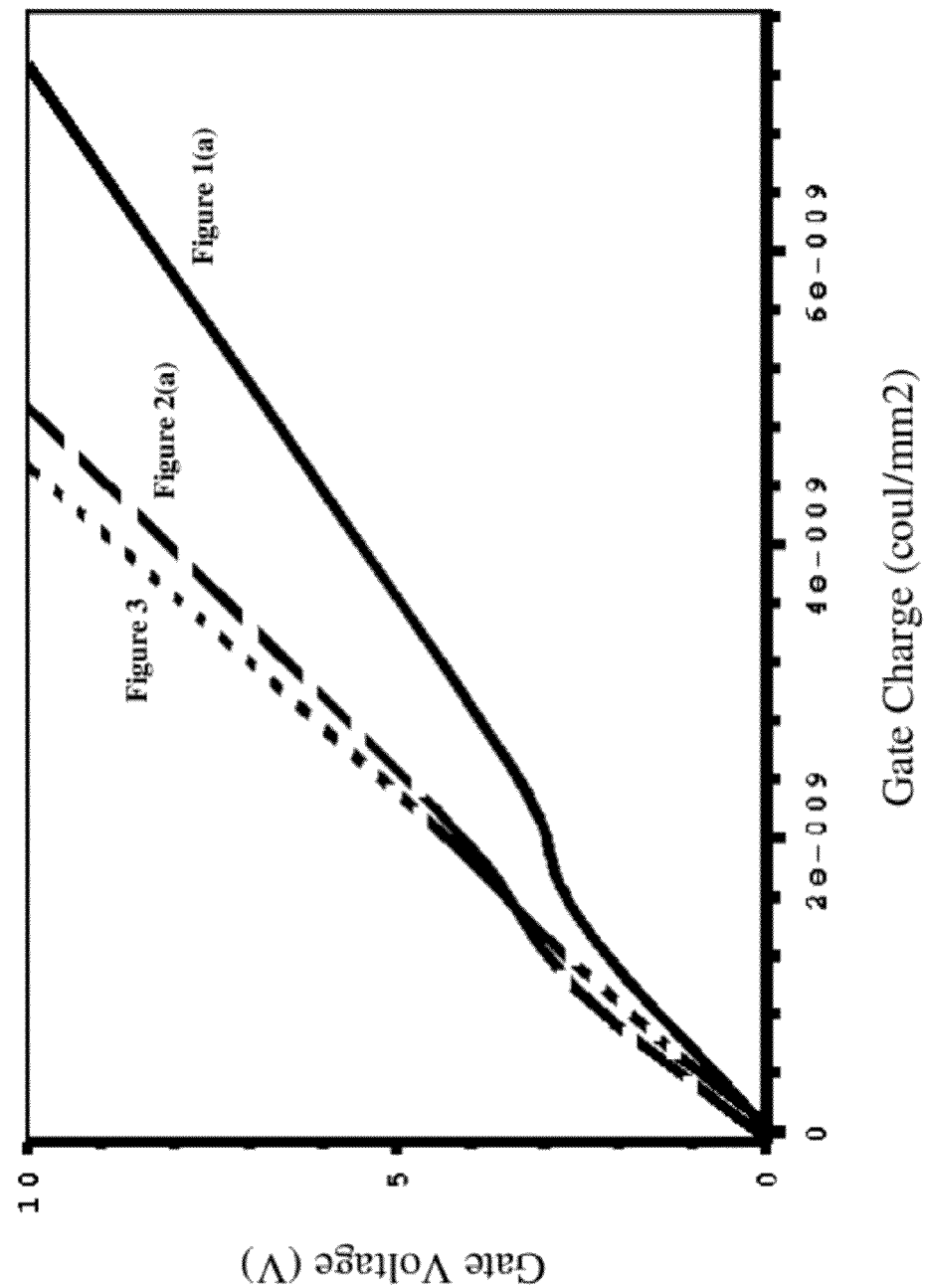
FIG. 6 shows simulation results.

FIG. 6 shows more detailed data for three devices. One is an example of the type shown in FIG. 1(*a*), one is an example of the type shown in FIG. 2(*a*), and one is an example of the type shown in FIG. 3. The curves show the relation between applied voltage and charge density on the gate. Note the "flat spot" in the curve for FIG. 1(*a*): if the voltage is increase to about 2.7V applied, the gate charge has to shift from about 1.8 Coulomb per square millimeter to about 2, before the gate voltage can be increased further. The width of this step shows the density of the "Miller charge" which must be pumped into and out of the gate on every switching cycle. Reduction of Miller charge is desirable.

By comparison, note that the width of the "flat spot" in the curve for the FIG. 2(*a*) is much less, and that for FIG. 3 is almost nonexistent.

These results clearly demonstrated that considerable improvement on device gate charge and capacitances can be achieved by making use of the new device structures.

Example of Fabrication Process

This application also discloses a simple fabrication process for manufacturing the empty space power MOSFET. The detailed process flow is illustrated in FIGS. 7(*a*) to 7(*h*).

Starting with N+ substrate 110, an N– epitaxial layer is grown. This growth step is followed by an oxidation step which may be followed by an oxide deposition step. The resulting oxide 701 is patterned to form the hard mask for trench etch. The silicon etch step is carried out to form the top wide trench (FIG. 7(*a*)).

Next, a sidewall spacer 702 is created inside the trench by dry etchback of a oxide/SiN stack (FIG. 7(*b*)).

Using the spacer 702 as an additional hardmask, the second silicon etch step is done to create the narrow bottommost trench part 198B (FIG. 7(*c*)).

After removal of the hard mask and spacer layers 701 and 702, a thin pad oxide liner 704 is optionally grown along the trench surface (FIG. 7(*d*)). This helps improve the quality of the semiconductor interface.

Then, as shown in FIG. 7(*e*), an oxide deposition process (such as PE-TEOS or LTO) is used to close the top surface of the bottom trench 198B without filling it up. This results in an Empty Space zone 180 surrounded by an enclosure oxide 182. The depth and width of the bottom trench 198B, as well as its profile, can be adjusted to form the empty space zone 180 with whatever size and height are desired. A trench profile with a high aspect ratio is preferred for fast close up of the bottom trench surface. In addition, for a fixed trench depth and width, the oxide deposition process conditions can also be tuned to vary the empty space zone size.

After forming the empty space zone, a bottom-up filling technique, such as High Density Plasma (HDP), can be employed to completely fill up the top wide trench with insulator 712 (such as oxide), followed by a planarization process (such as CMP). This results in the structure shown in FIG. 7(*f*).

A normal oxide etch, perpendicular to the surface, is then used to etch back the oxide surface, and to clear the upper trench 198A down to a desired depth as depicted in FIG. 7(*g*). This step opens up the active gate trench region.

Starting with this process step, a standard fabrication process of trench MOSFET is employed to produce the final device structure shown in FIG. 7(*h*).

Figure 8B:
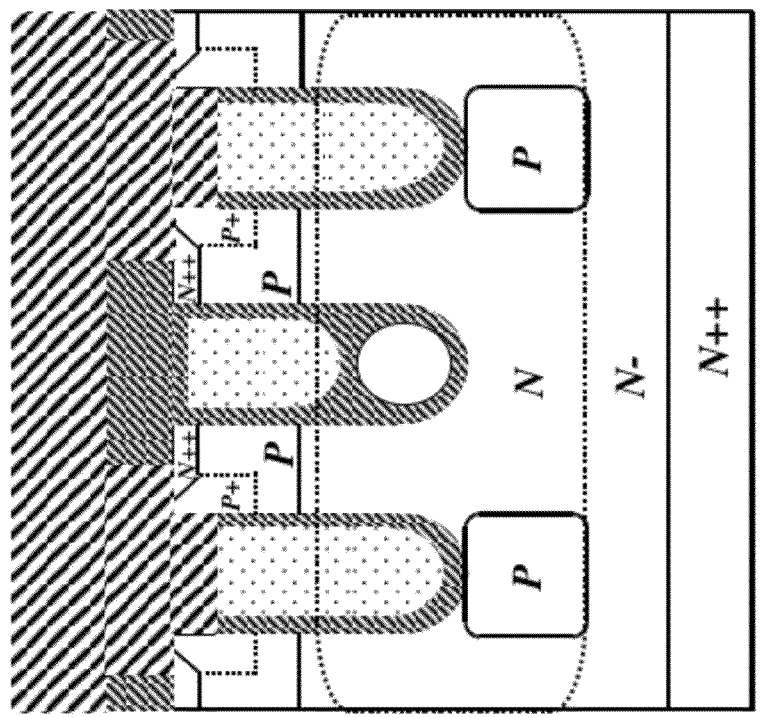
FIGS. 8(a) and 8(b) show vertical power devices which include a empty space zone is present in the gate trenches, but not in the recessed field plate (RFP) trenches.
Figure 8A:
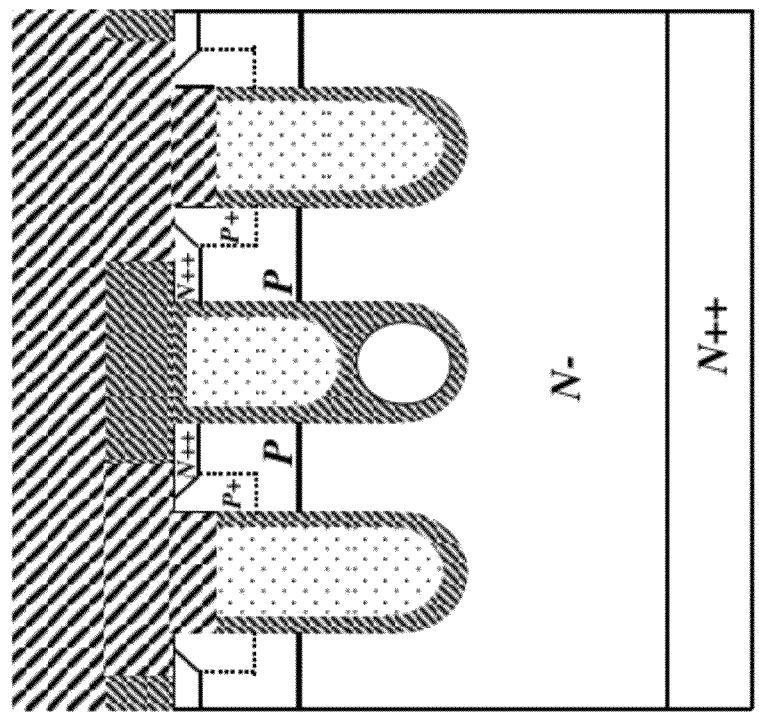

Furthermore, the concept proposed in this application can be used to improve the switching performances of variety of power semiconductor device structures. Two classes of such embodiments are shown in the vertical trench devices in FIGS. 8(*a*) and 8(*b*). In these examples, note that a empty space zone is present in the gate trenches, but not in the recessed field plate (RFP) trenches. In the example of FIG. 8(*a*), both types of trenches have the same etched depth, but this too can be varied. For example, in the embodiment of FIG. 8(*b*), an n-type implant is provided to locally enhance the N-Epi doping and a p-type implant is provided at the bottom of the RFP trench, to avoid crowding of isopotential lines under reverse bias.

Figure 9:
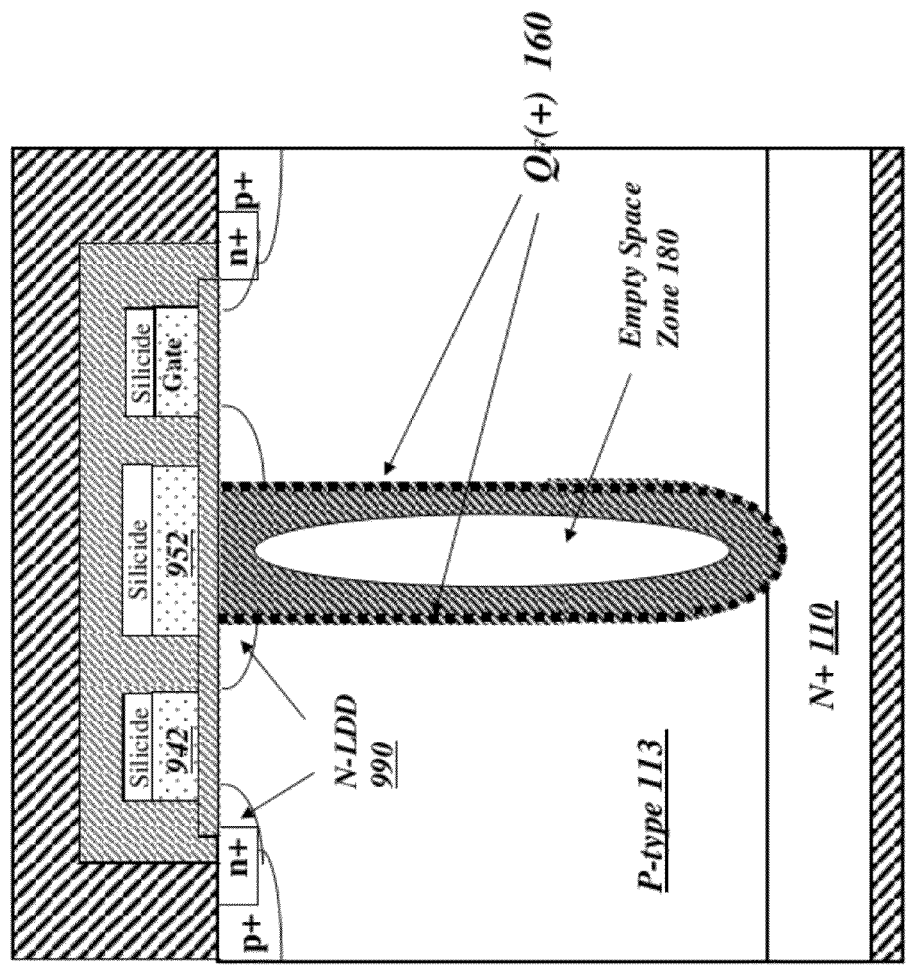
FIG. 9 and FIG. 10 show quasi-lateral devices where empty space zones are included in vertical field-shaping trenches.

In another class of embodiments, empty space zones are included in vertical field-shaping trenches in a quasi-lateral device, as shown for example FIG. 9. In this particular example a silicided planar gate 942 is used to control a lateral channel, and n-type LDD regions 990 are used to minimize series resistance from this channel to the source and to the drift region. A p-type epitaxial layer 113 is used, and positive permanent electrostatic charge 160 is included at or near the sidewalls of the deep trench, so that the drift trajectories of majority carriers (electrons) are approximately vertical. In this example a planar shield electrode 952, connected to the source voltage, lies directly above the trench, to reduce parasitic gate-drain capacitance. Both gate and shield electrodes are silicided.

Figure 10:
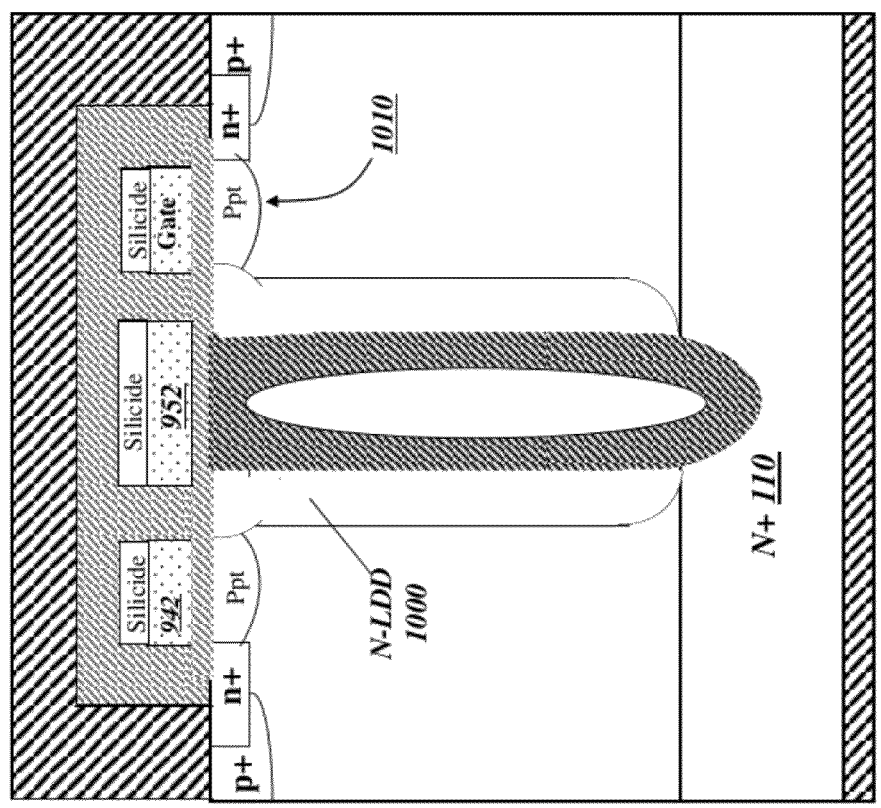

FIG. 10 is generally similar to FIG. 9, except that a vertically extended lightly doped drain extension 1000 is added. (This can be formed, for example, by an n-type implant and outdiffusion from the trench sidewalls.) Also note that an anti-punchthrough implant 1010 has been added below the gate, to increase the voltage at which punchthrough occurs.

Another class of embodiments is applied to lateral trench gated devices in FIGS. 11, 12, 13, 14, and 15. The devices shown in these Figures are typically laterally symmetric, with a lateral drift region to the left of the gate matching the one shown to the right of the gate.

Figure 11:
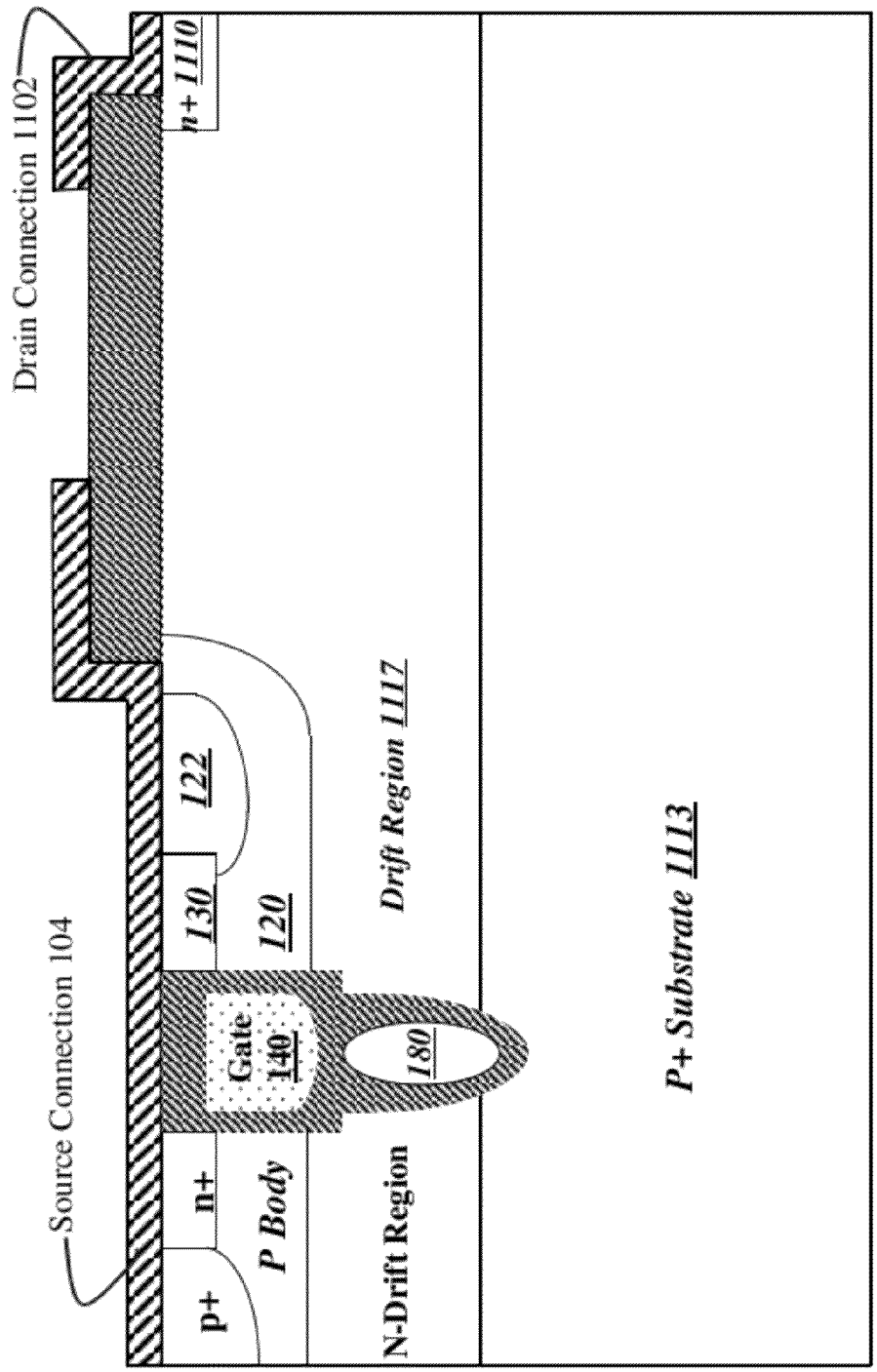
FIGS. 11-15 show a variety of lateral trench gated devices which include insulated empty space zones in the drift region and/or in the gate trench.

In the device of FIG. 11, the current control structure is generally similar to that of FIG. 2(a). An insulated gate 140 controls vertical conduction from an n+ source through the channel, i.e. the portion of the p-type body 120 which is nearest the gate. An empty space zone 180 lies below the gate 140 in the same trench, and provides reduced capacitive loading as compared to a solid dielectric.

However, the drift and drain geometries of FIG. 11 are very different from those of FIGS. 2(a)-5: majority carriers injected by the current control structure flow laterally through the N-type drift region 1117 to an n+ topside drain 1110, which is contacted by a frontside electrode 1102. The drift region 1117 overlies a p-type substrate 1113. Note that the channel here is predominantly vertical (or, more precisely, that the electron trajectories in the channel are predominantly vertical); but the electron trajectories in the drift region 117 are primarily (though not totally) horizontal. The lateral separation between the channel and drain is defined by patterning, and is typically longer for higher voltage operation.

Figure 12:
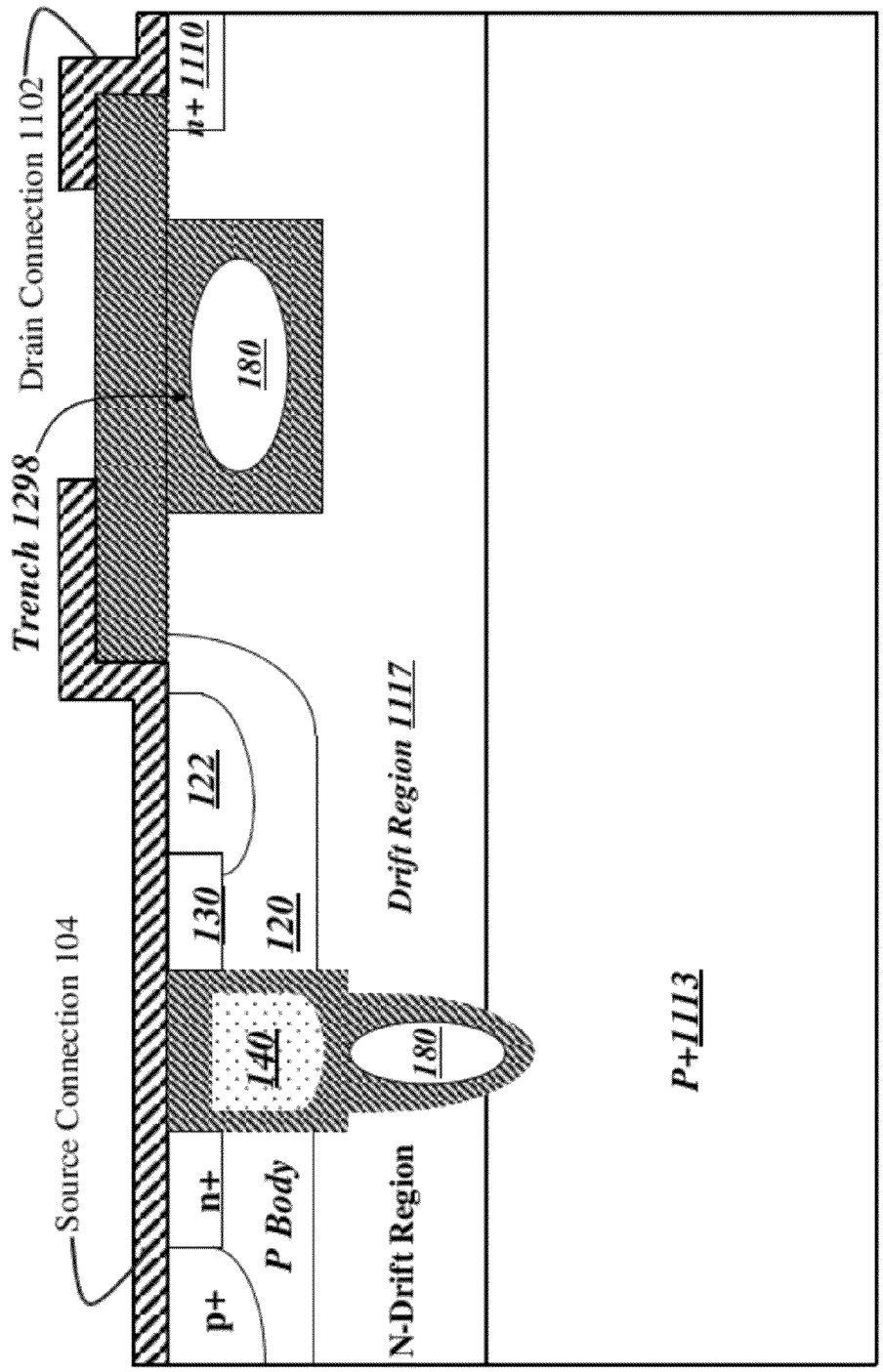

FIG. 12 is somewhat similar to FIG. 11, but has an important addition: a void-filled trench 1298 which improves breakdown voltage by reducing surface electric field And reducing gate-drain capacitance Cgd.

Figure 13:
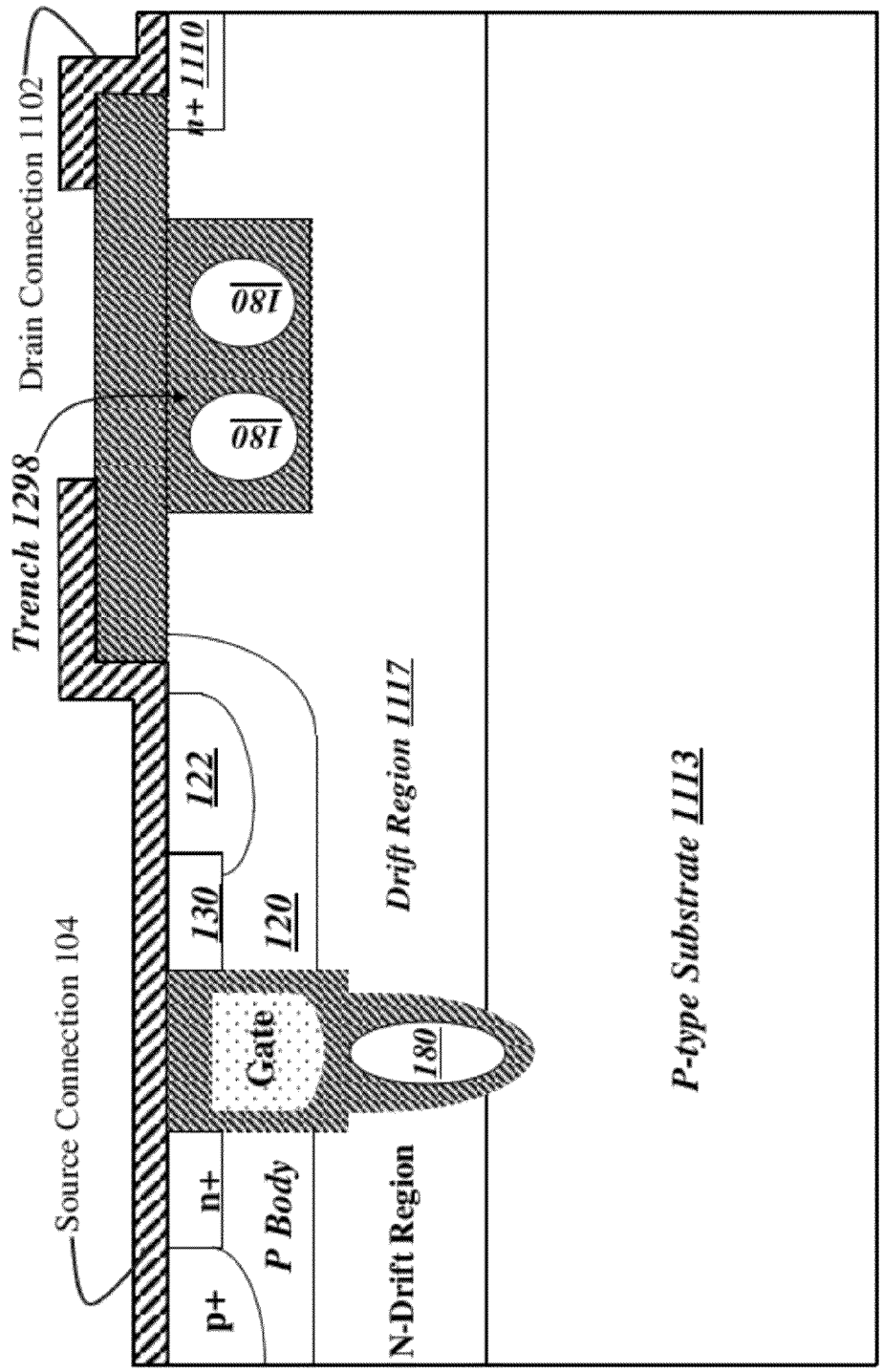

FIG. 13 differs from FIG. 12 in that multiple empty space zones 180 are located within the trench 1298. This can be useful for higher-voltage lateral devices. This is particularly advantageous in permitting selection of a single trench aspect ratio for optimal closure of the empty space zone 180, while also allowing the dimensions of 1298 to be chosen for optimal device behavior.

Figure 14:
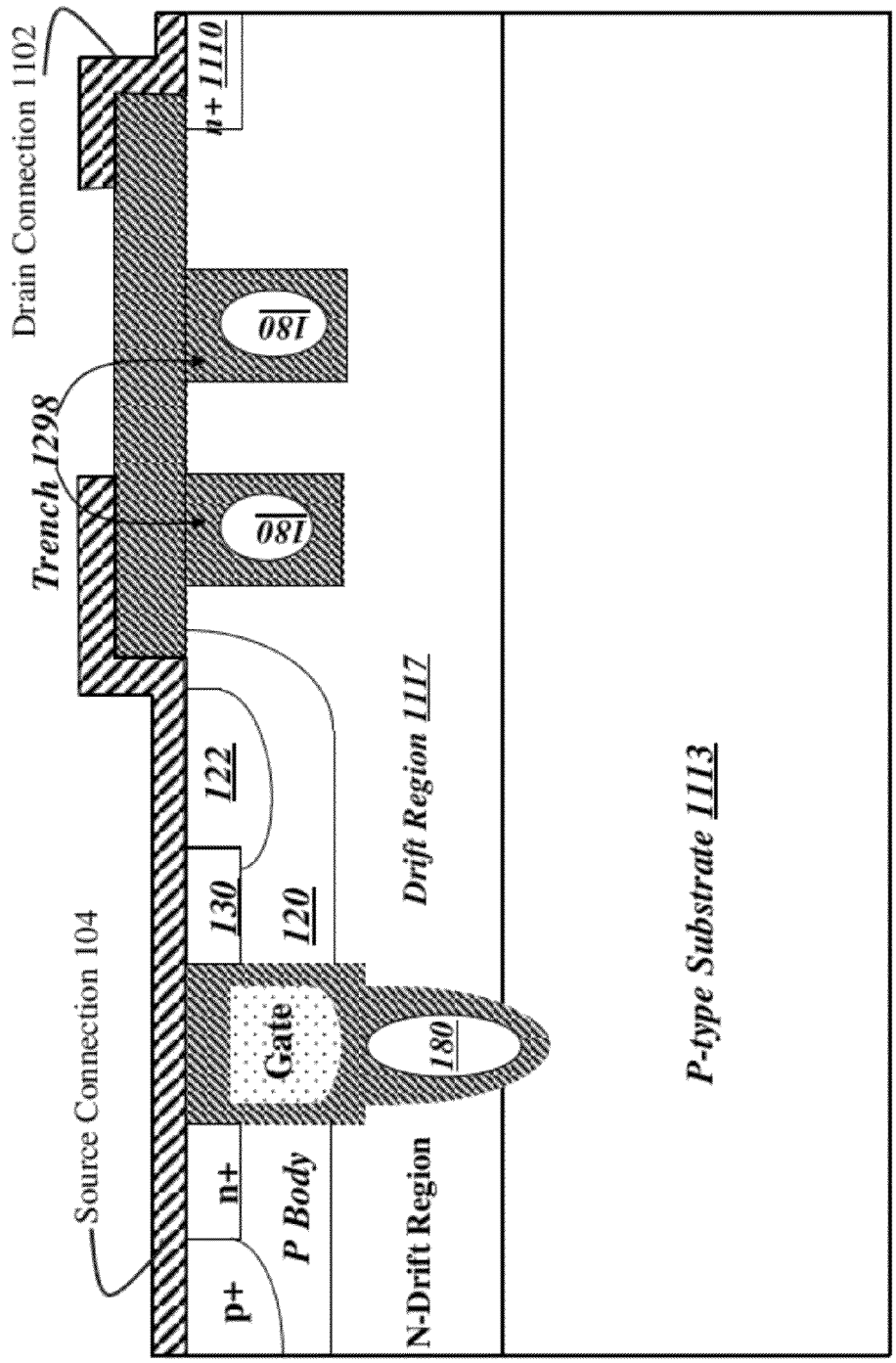

In a further alternative, as shown in FIG. 14, multiple void-filled trenches 1298 can be used, even though they do not abut each other.

Figure 15:
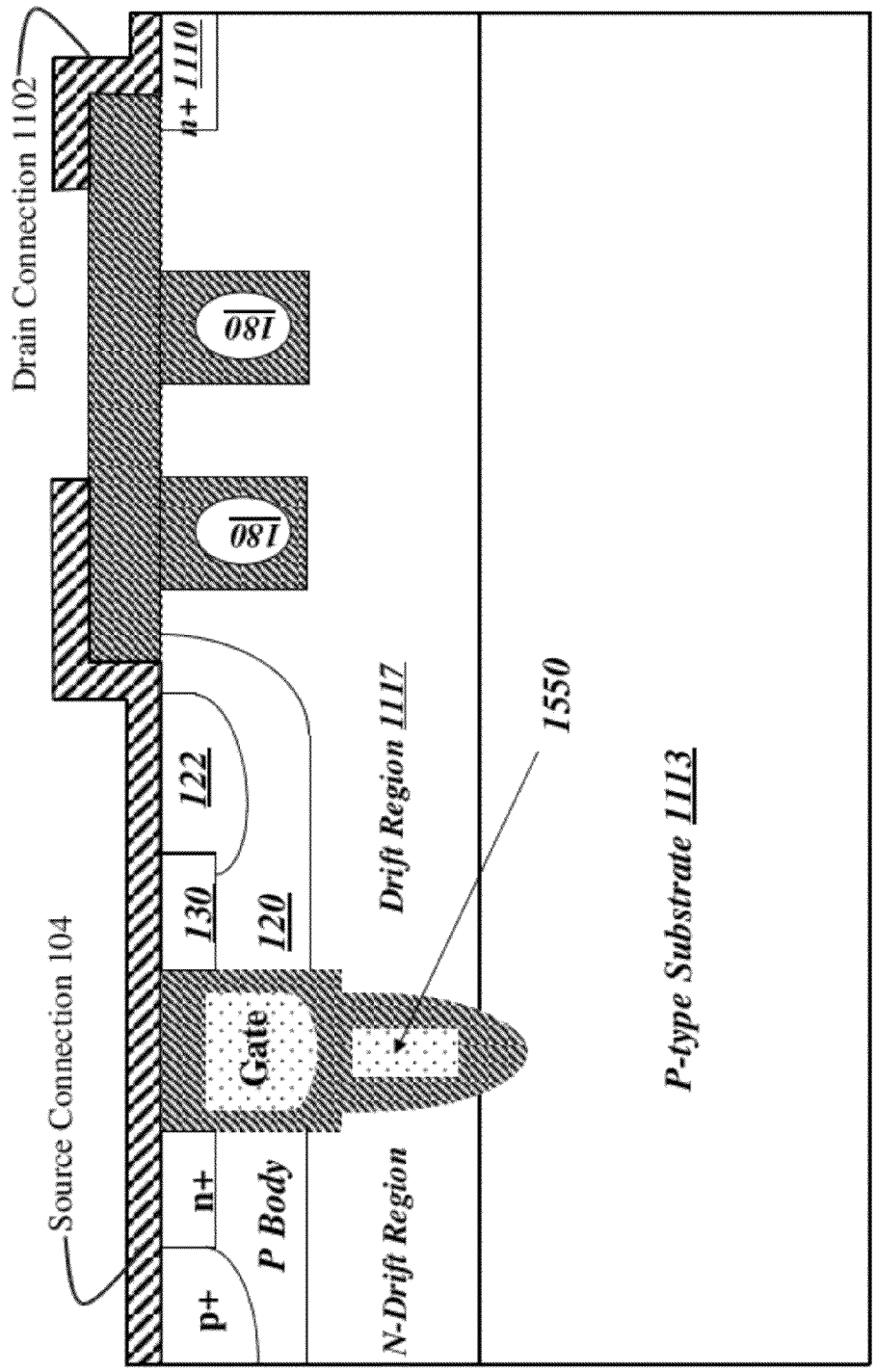

As shown in FIG. 15, one or more void-filled trenches 1298 can advantageously be used at the surface of the lateral drift region 1117, even though no empty space zone 180 is located in the same trench with the gate electrode 140. In this example, a vertically oriented shield plate 1550, tied to source, is also present in the trench below the gate.

Another class of embodiments applies empty space zone-filled trenches, alone or in combination with horizontal and/or vertical field plates, to lateral planar gated devices. Various examples of such devices are shown in FIGS. 16, 17A, 17B, 18, 19, 20, 21, 22, and 23. These figures are more schematic than those of FIGS. 11-15, but will be easily understood by those of ordinary skill.

Figure 16:
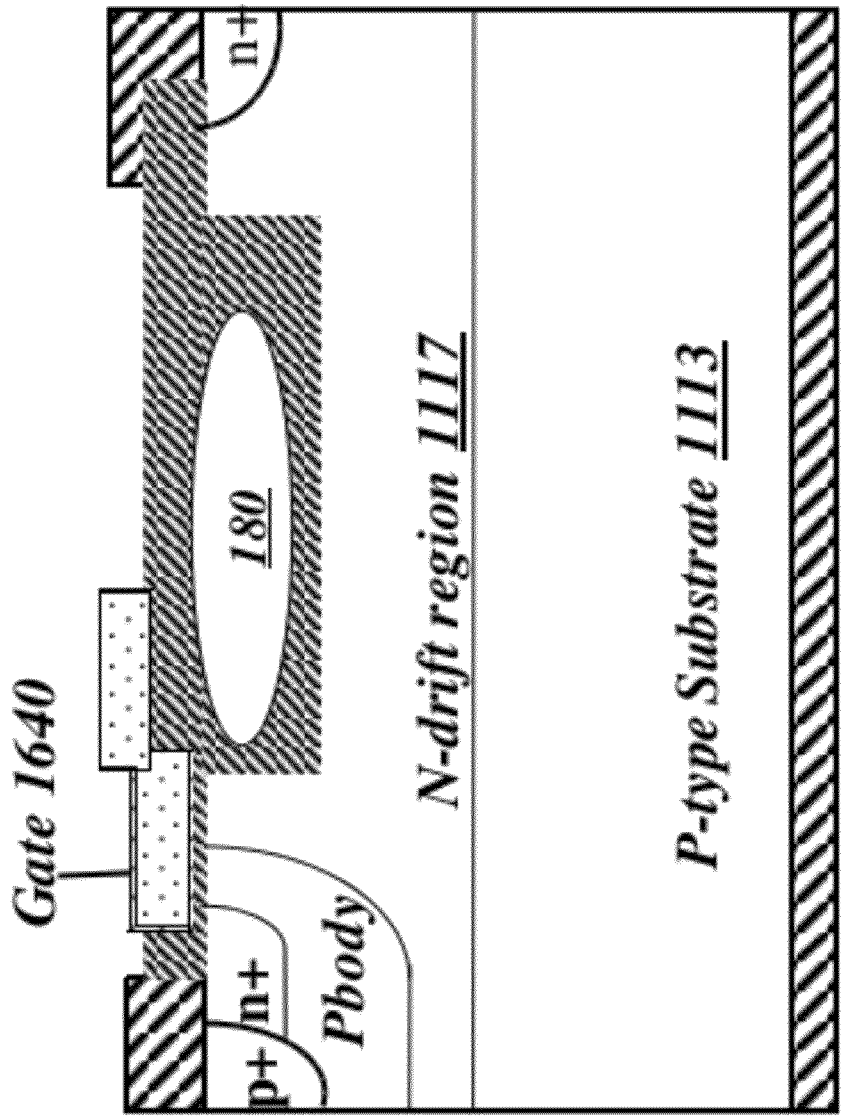
FIGS. 16, 17(a), 17(b), 18, 19, 20, 21, 22, and 23 show a variety of lateral planar gated devices, which include empty space zone-filled trenches, alone or in combination with horizontal and/or vertical field plates.

FIG. 16 shows an example of a first planar-gate lateral device embodiment. Here the channel is essentially lateral, and is located at the surface where the stepped gate 1640 overlaps onto the trench 1298. When the gate turns on the channel, majority carriers flow from the n+ source through the channel into a lateral drift zone 1117, The empty space zone (or zones) 180 in the trench help to reduce parasitic capacitance.

Figure 17B:
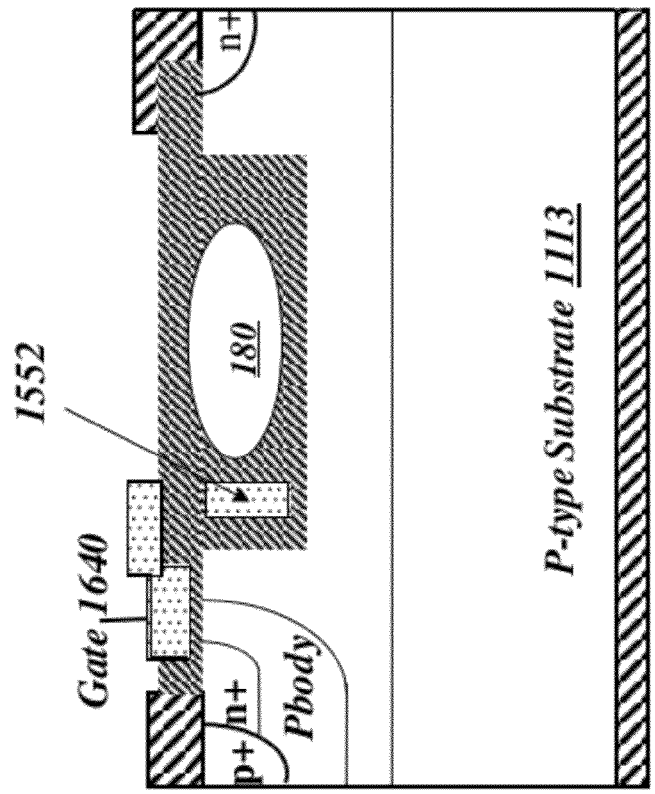
Figure 17A:
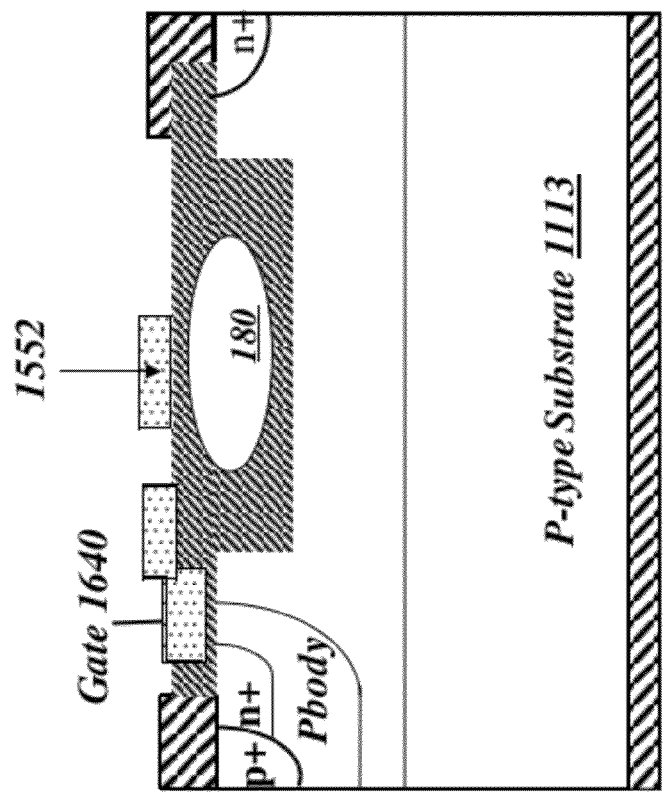

FIG. 17A shows another sample embodiment. This embodiment is generally similar to that of FIG. 16, except that there is a lateral poly plate 1552 (tied e.g. to source) above the trench, advantageously further reducing Cgd.

FIG. 17B shows another sample embodiment. This embodiment is generally similar to that of FIG. 16, except that there is a vertical poly plate 1552 in the trench which is tied to the source, reducing Cgd.

Figure 18:
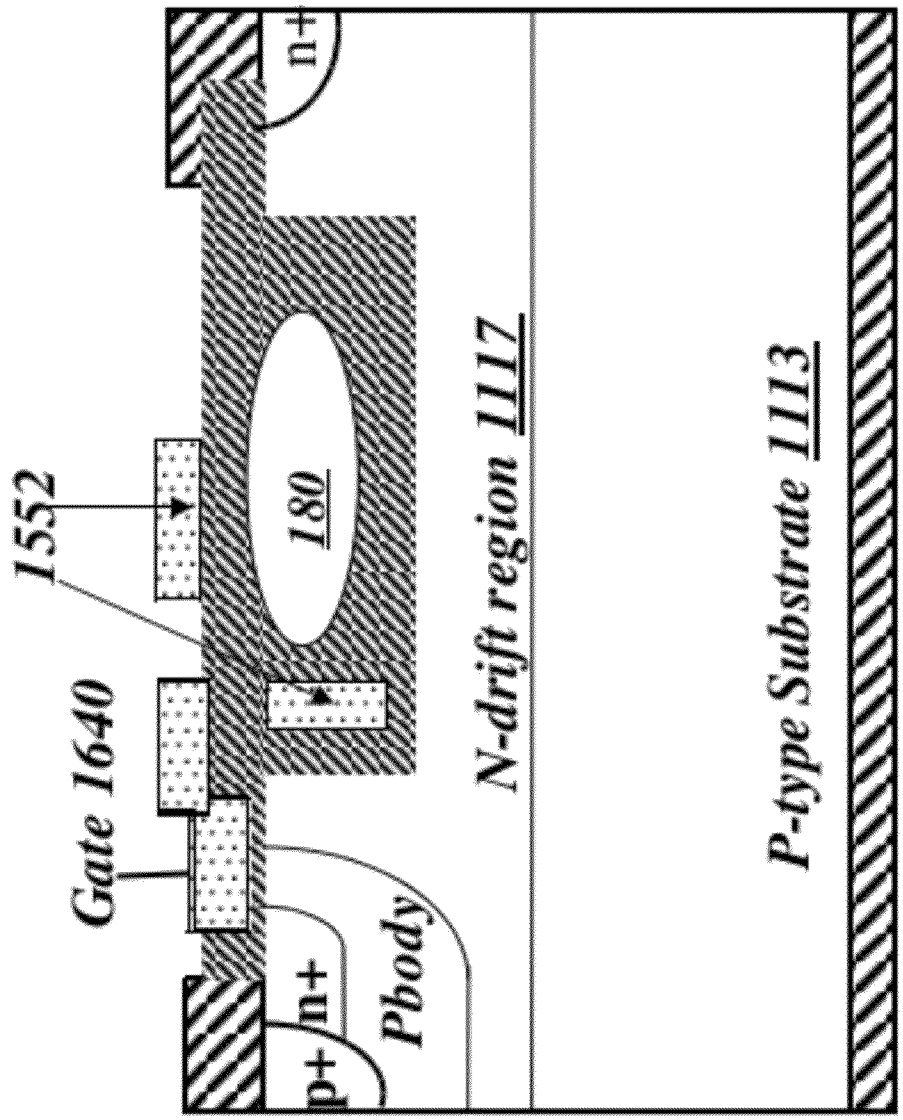

FIG. 18 shows another sample embodiment. This embodiment is generally similar to that of FIG. 16, except that it includes the poly plates 1552 of both FIGS. 17A and 17B. Both plates are preferably tied to the source, reducing Cgd.

Figure 19:
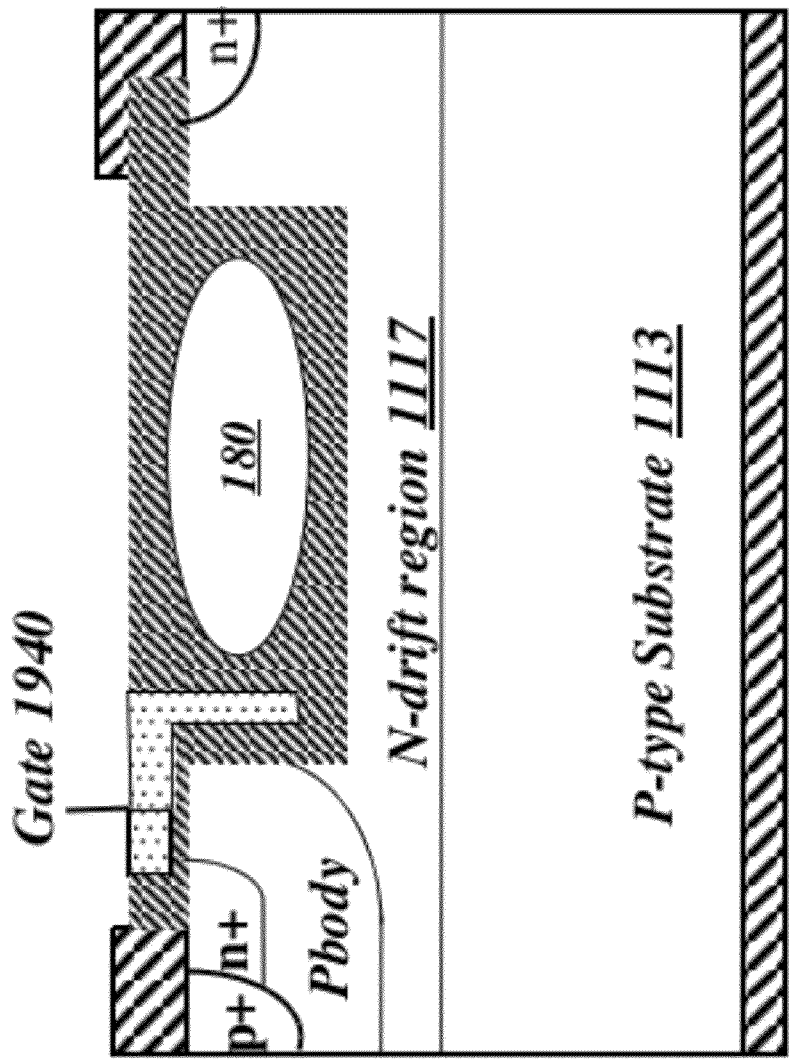

FIG. 19 shows another sample embodiment. This embodiment is generally similar to that of FIG. 16, except that the gate 1940 is extended so that it has a portion extending along one vertical surface of the trench. This gate can thus invert the body region along both horizontal and vertical surfaces, and the channel includes both horizontal and vertical portions.

Figure 20:
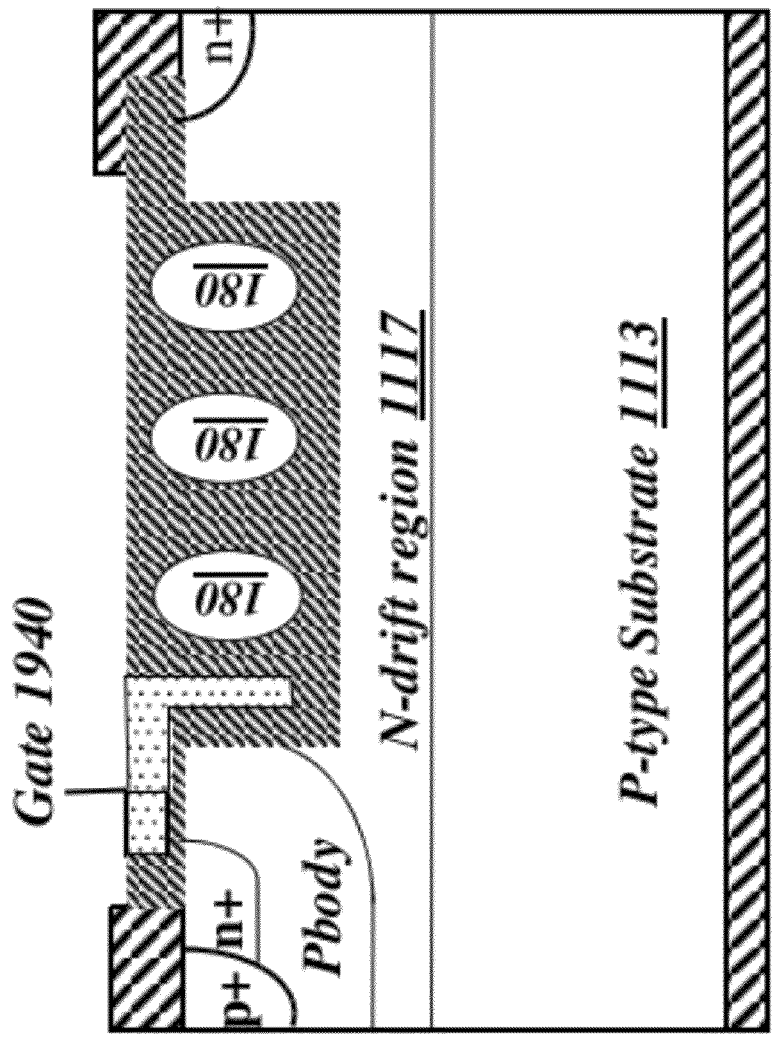

FIG. 20 shows another sample embodiment. This embodiment is generally similar to that of FIG. 19, except that the trench contains three smaller empty space zones 180 rather than one large empty space zone.

Figure 21:
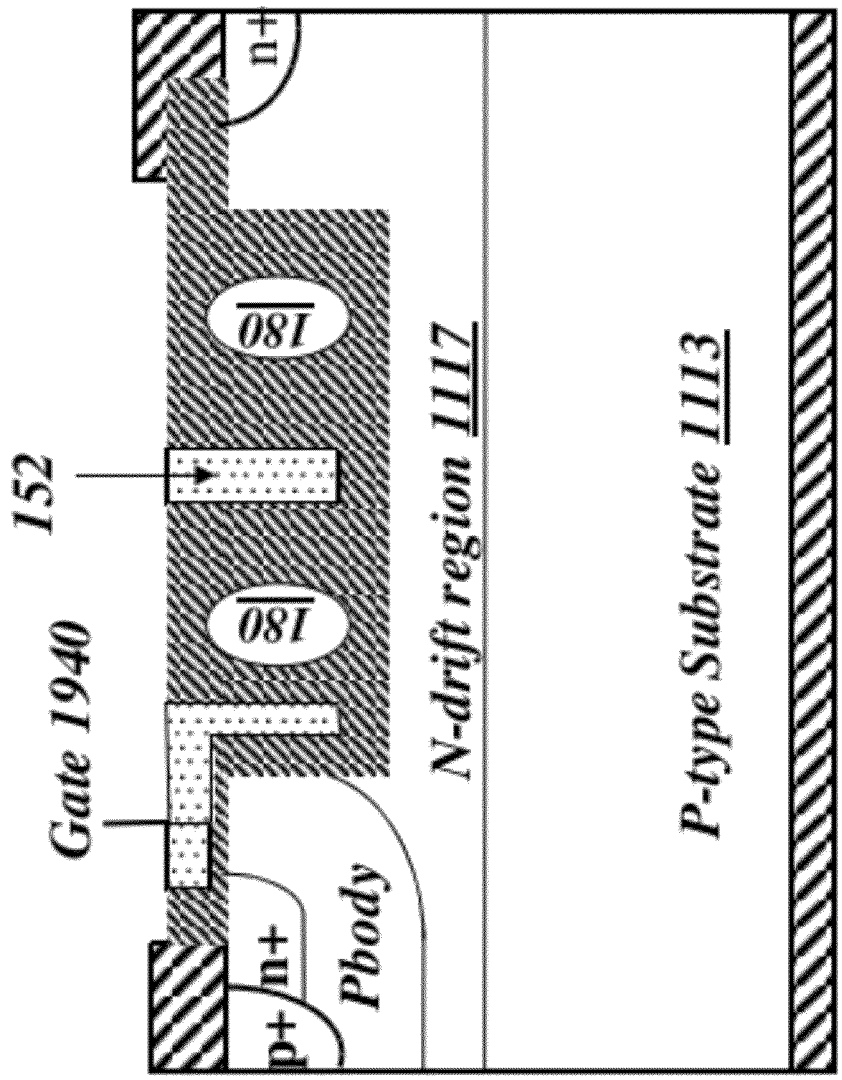

FIG. 21 shows another sample embodiment. This embodiment is generally similar to that of FIG. 20, except that a poly plate 1552 (which can, for example, be tied to source) is substituted for the middle empty space zone, reducing gate-drain capacitance.

Figure 22:
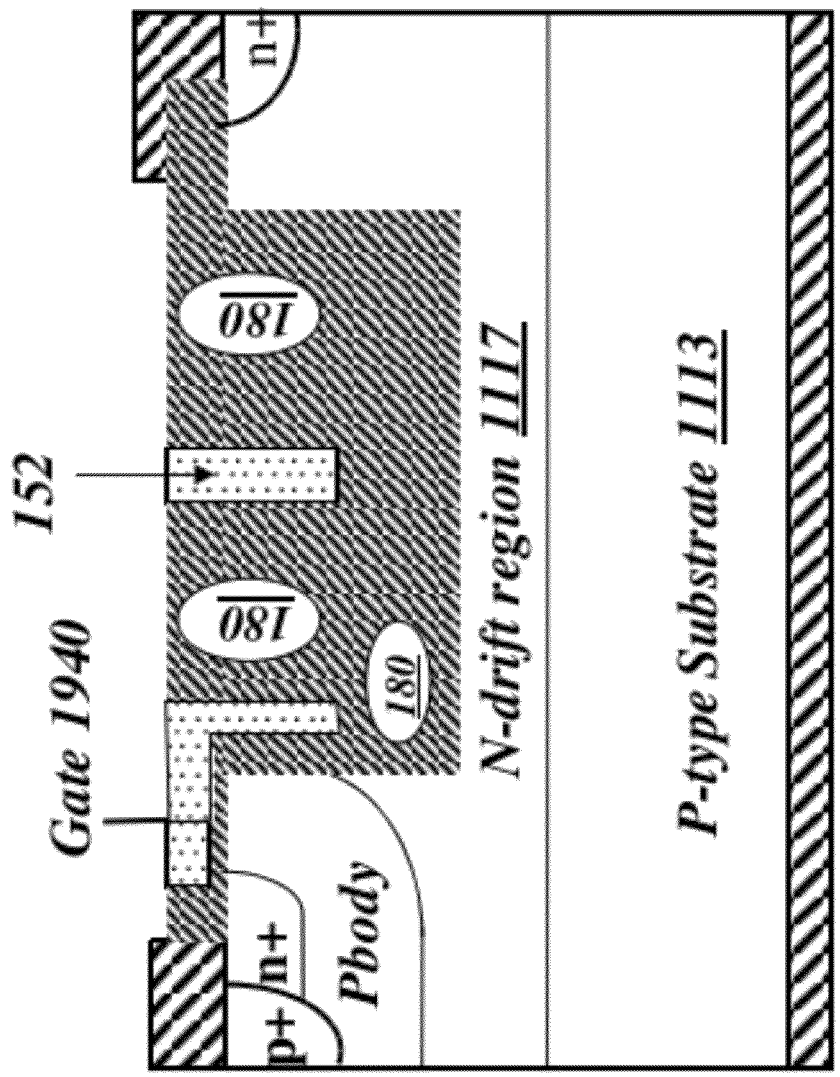

FIG. 22 shows another sample embodiment. This embodiment is generally similar to that of FIG. 21, except that a third empty space zone is present between the bottom of the gate in the trench and the underlying drain region, further reducing Cgd.

Figure 23:
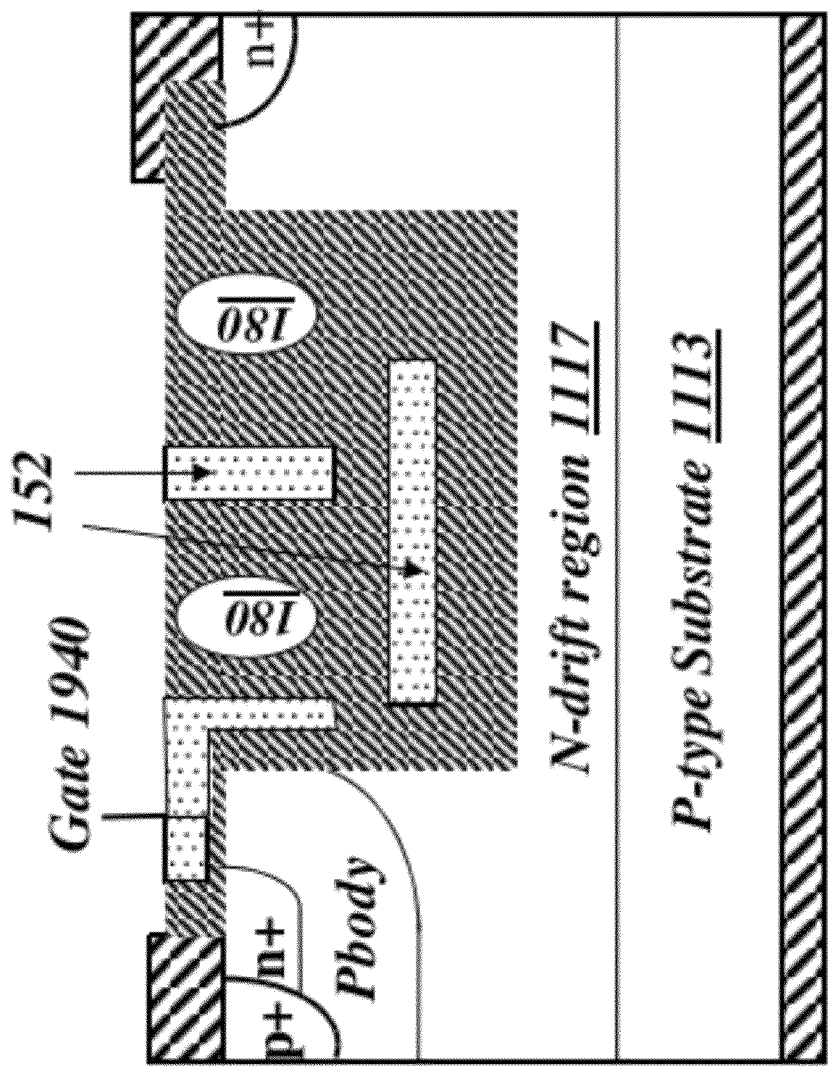

FIG. 23 shows another sample embodiment. This embodiment is generally similar to that of FIG. 21, except that there is a horizontal plate 1552 of polysilicon (or the like) tied to source near the bottom of the trench, reducing parasitic Cgd capacitance.

Realization of the empty space zones in the lateral devices of FIGS. 11 to 23 can be achieved by using variations of the technique shown in FIG. 7.

A large and important class of embodiments, which may arguably be regarded as a special case of the above teachings, has particular advantages and will now be described in detail.

Figure 24A:
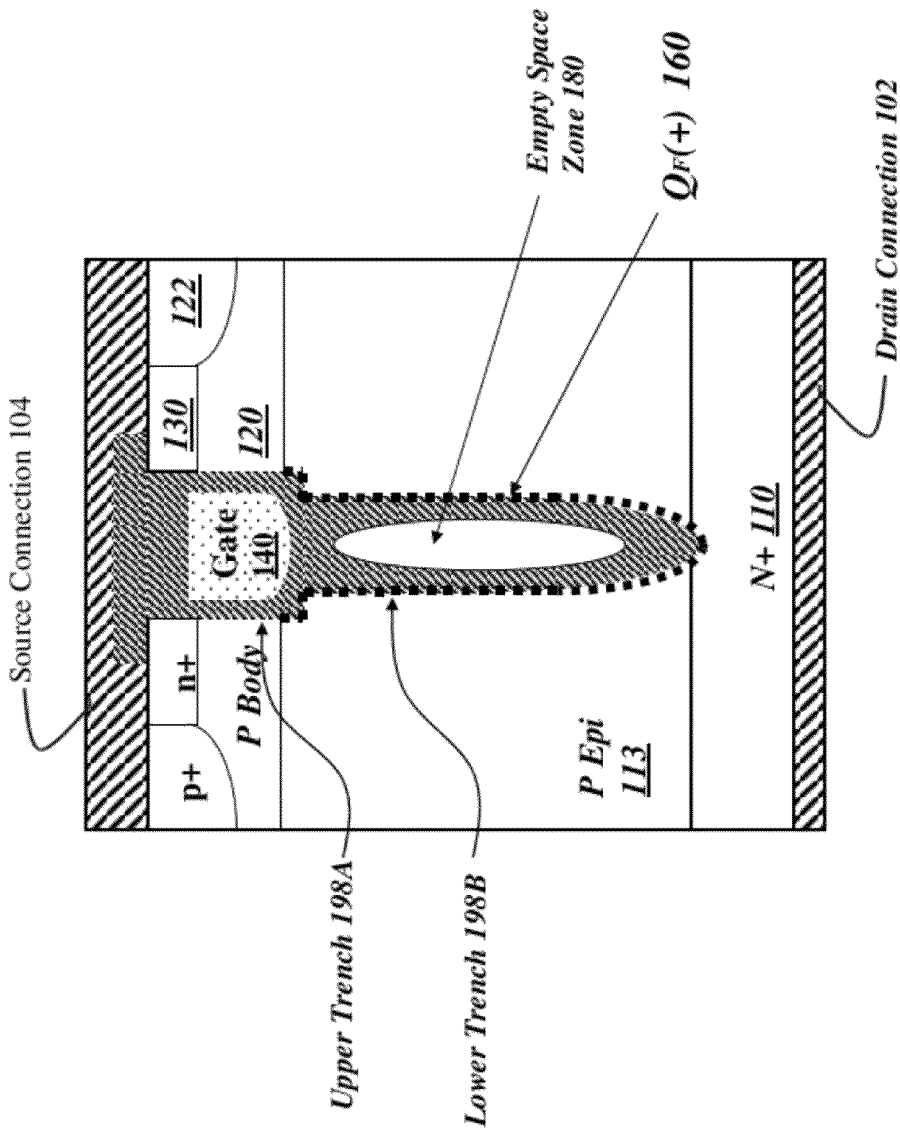
FIGS. 24(a)-24(b) show a variety of MOSFET structures which include an insulated empty space zone, and intentionally introduced permanent charge, in the lower portion of multi-width trench.

In this class of embodiments, several different device structures are disclosed to overcome the problems of prior art devices of filling the trench with dielectric material and forming a gate electrode within the trench. FIG. 24(a) shows a MOSFET structure which includes permanent charge 160, and which uses a multi-width trench. The trench in FIG. 24(a) has two main sections, with a greater width at the upper section 198A and a lesser width at the lower section 198B. This difference in width facilitates using a dielectric material 182 to reliably close and seal the neck of the narrow trench section while at the same time completely filling the wider top section. Having the top wider trench section completely 198B filled with dielectric material allows reliable subsequent controlled etchback, to form the gate electrode without problems due to uncontrolled voids. This also allows fabrication of device structures, after the deep trench is formed, without decrease in the device geometry.

Figure 24B:
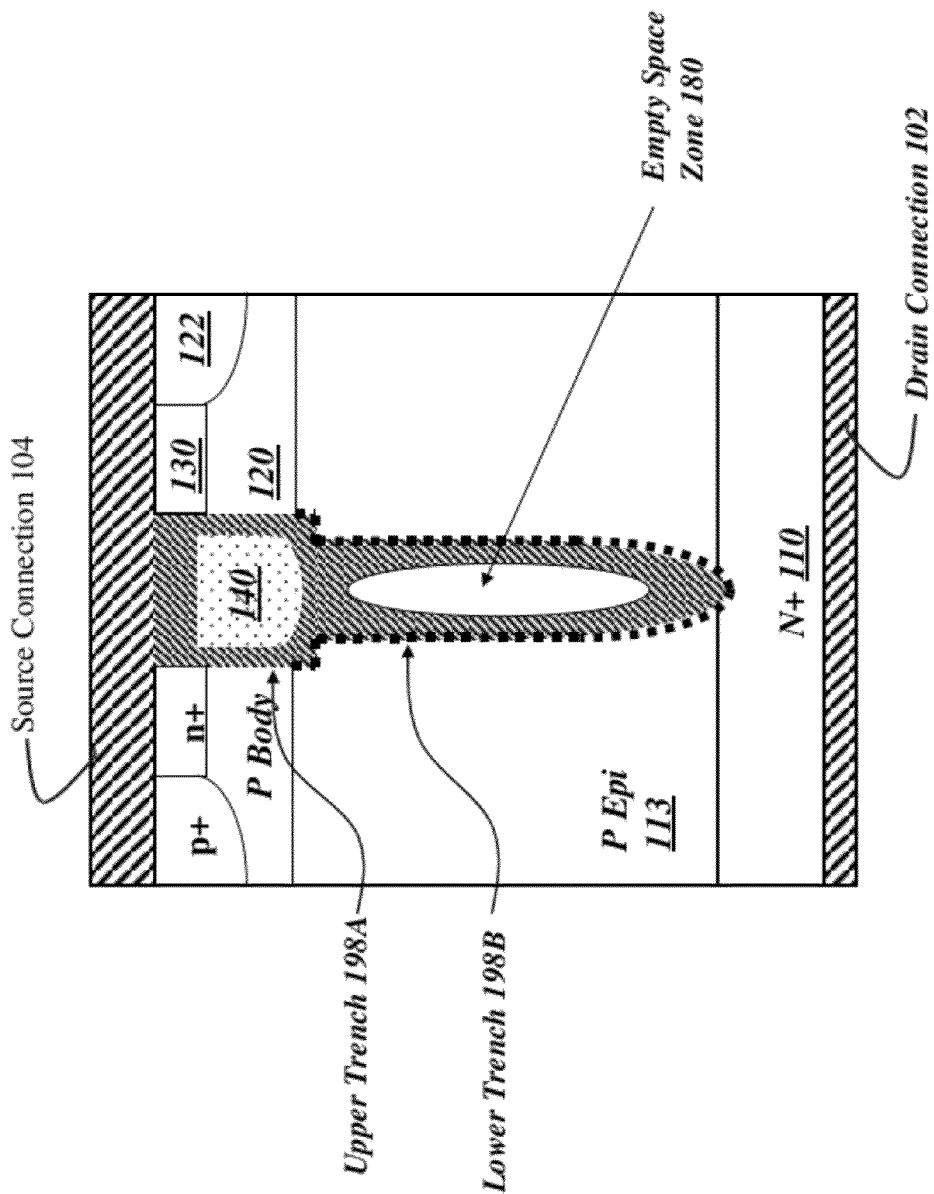

The device shown in FIG. 24(b) is similar to that of FIG. 24(a), but with a planarized dielectric surface over the trench (as distinguished from the "nailhead" structure of FIG. 24(a)).

Figure 25:
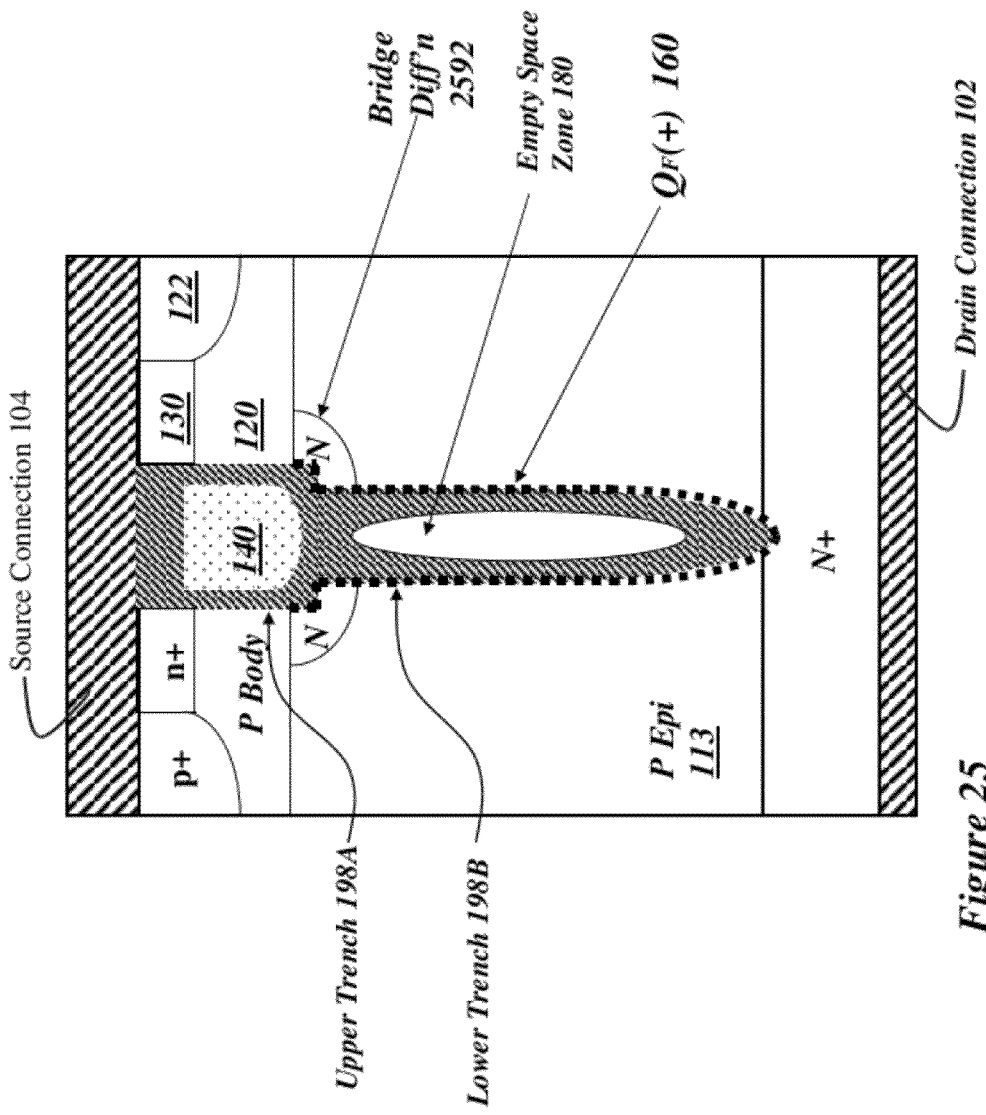
FIG. 25 shows another example of a device structure.

The device shown in FIG. 25 is similar to that of FIG. 24(a), but has an additional n-layer bridge diffusion 2592 between the wide and narrow trench sections to facilitate current flow from the channel to the n-inversion layer formed at the trench wall.

Figure 26A:
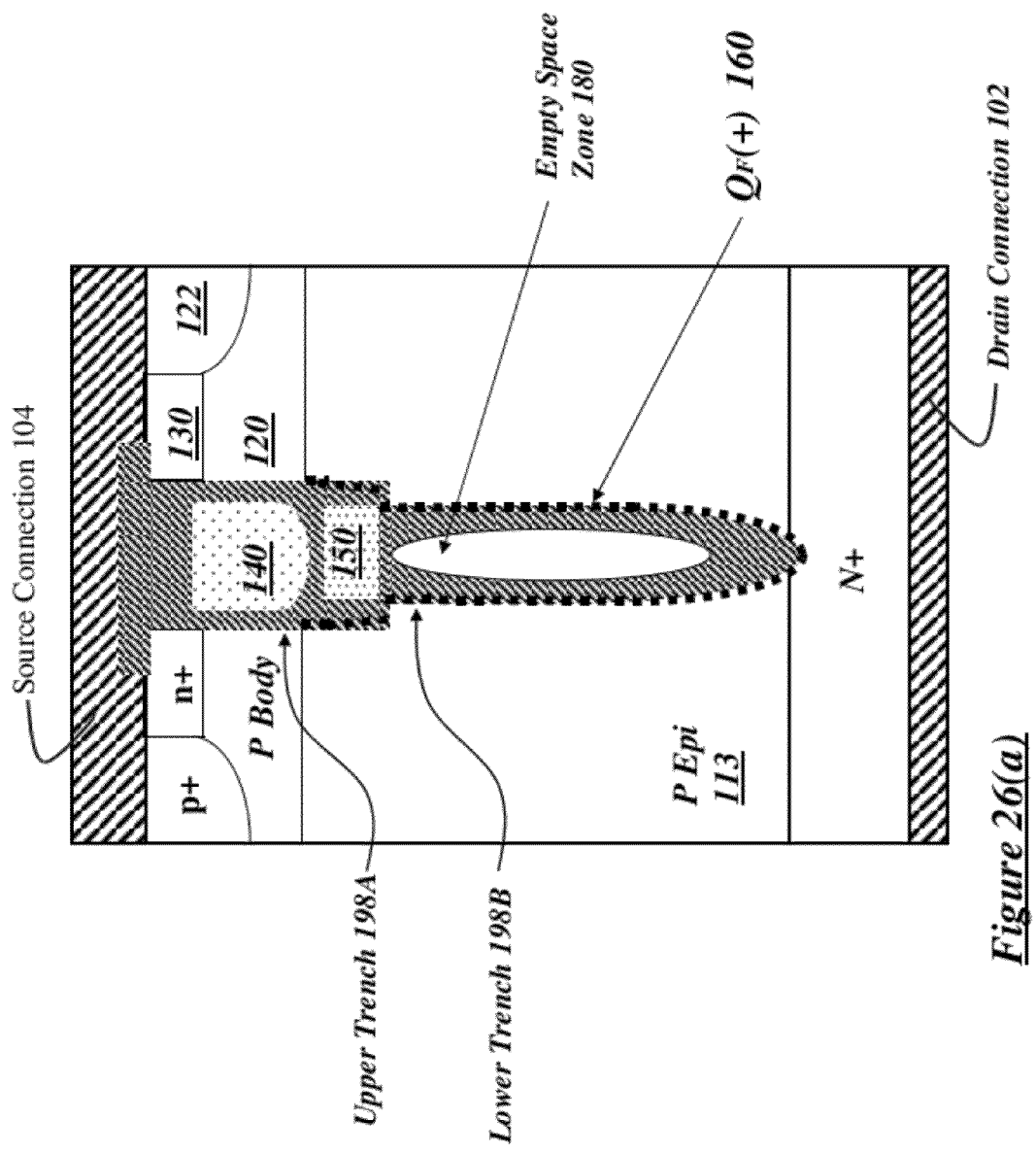
FIG. 26(a) shows another example of a device structure, which includes an additional shield electrode.

The device shown in FIG. 26(a) is generally similar to that of FIG. 24(a), but has an additional shield electrode 150 to reduce gate-drain capacitance Cgd. The shield electrode is preferably electrically connected to the source.

Figure 26B:
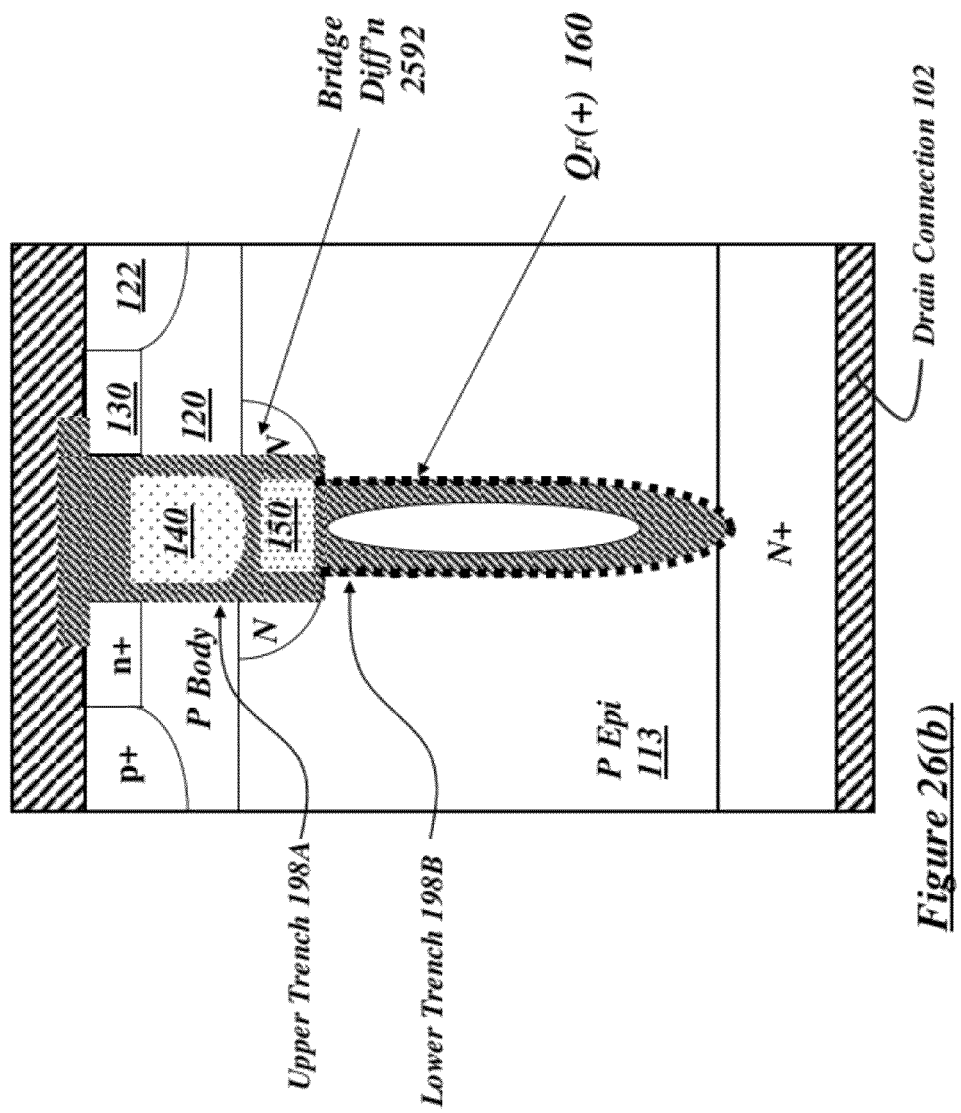
FIG. 26(b) shows another modified device structure.

The device of FIG. 26(b) is generally similar to that of FIG. 26(a), but with an additional N-type bridge diffusion 2592 as in FIG. 25.

FIGS. 27(a)-27(j) show one method of fabricating the device. Starting with an N+ substrate, an N− epitaxial layer is grown, followed by an oxidation. The trench mask is applied and patterned, to form the hard mask for trench etch. A silicon etch step is now carried out to form the top wide trench. This results in the structure shown in FIG. 27(a).

Next, a spacer is created inside the trench, by oxide/SiN deposition and dry etchback. This results in the structure shown in FIG. 27(b).

A second silicon etch step is now performed, preferably using the spacer itself as the mask, to create the narrow bottommost trench. This results in the structure shown in FIG. 27(c).

After removal of the spacer layers, an oxide liner is optionally grown along the trench surface. This results in the structure shown in FIG. 27(d)).

Figure 27B:
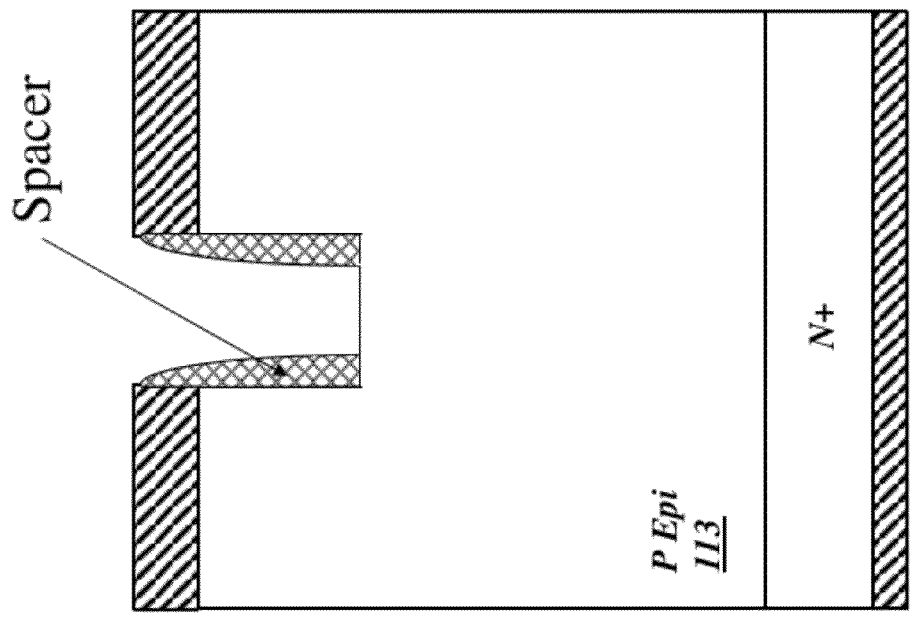
FIGS. 27(a)-27(j) show a fabrication sequence for devices as in FIG. 24(a) etc.
Figure 27A:
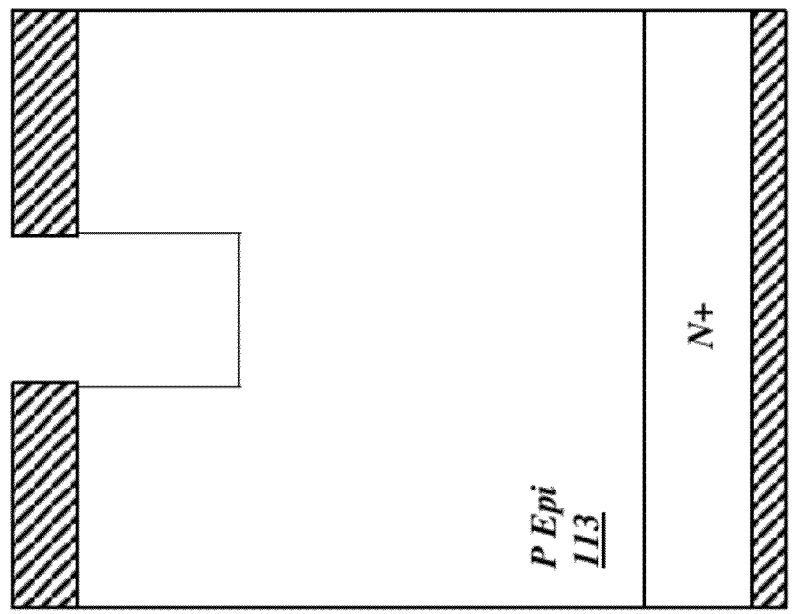
Figure 27D:
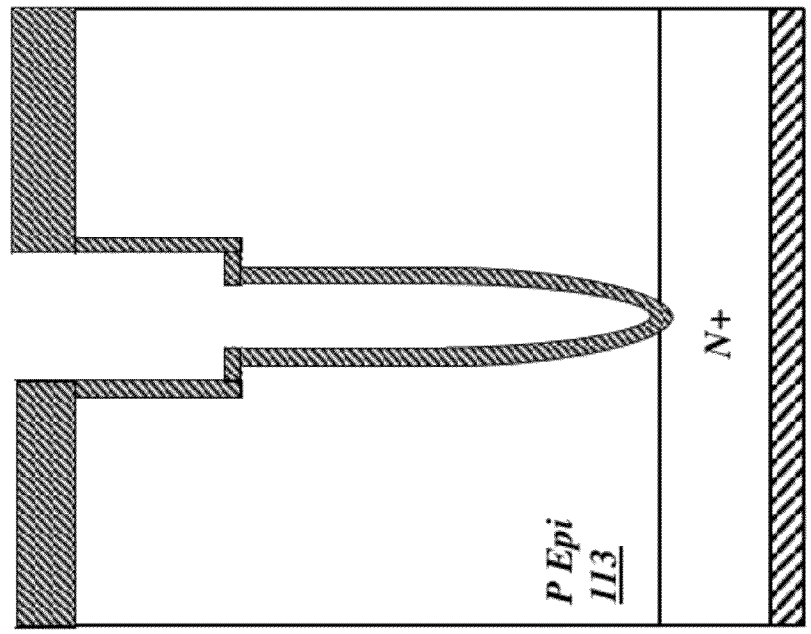
Figure 27C:
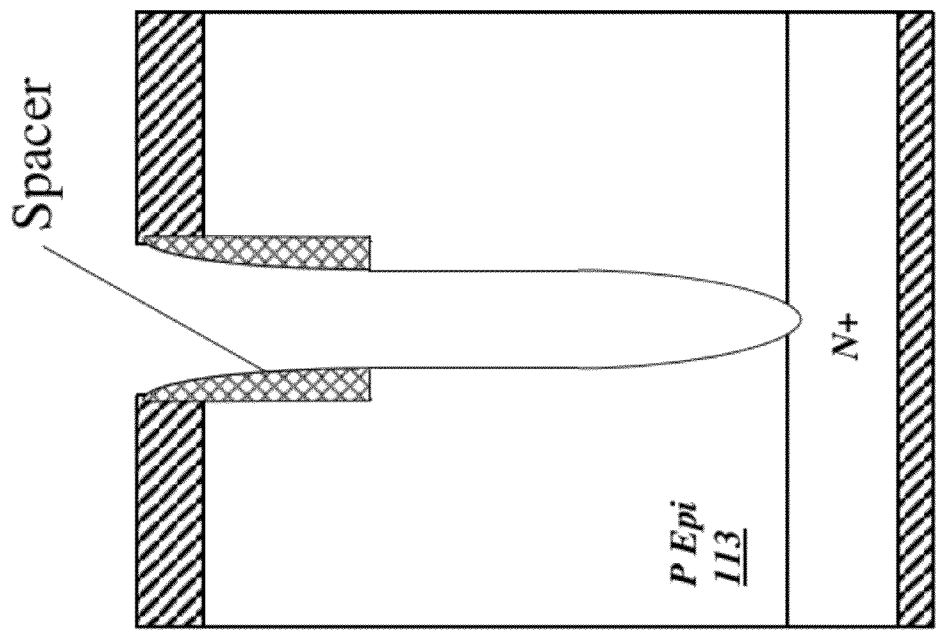
Figure 27F:
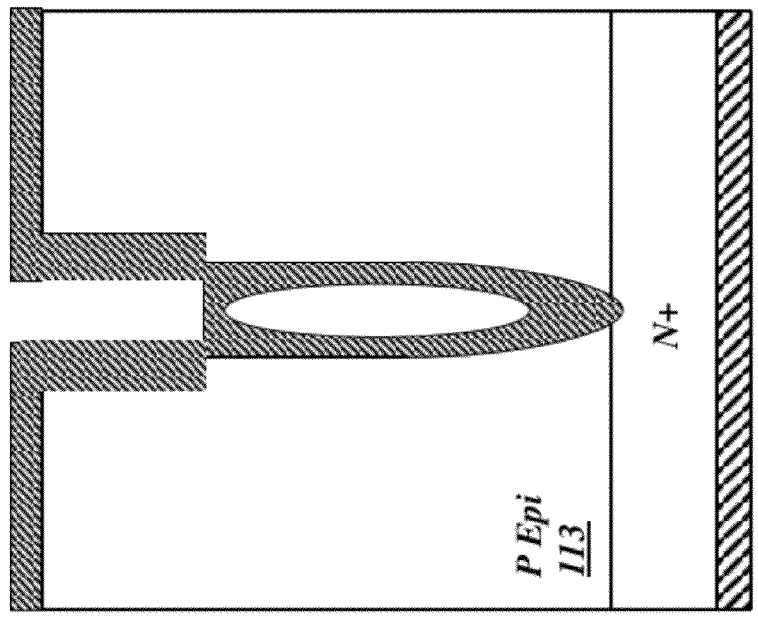
Figure 27E:
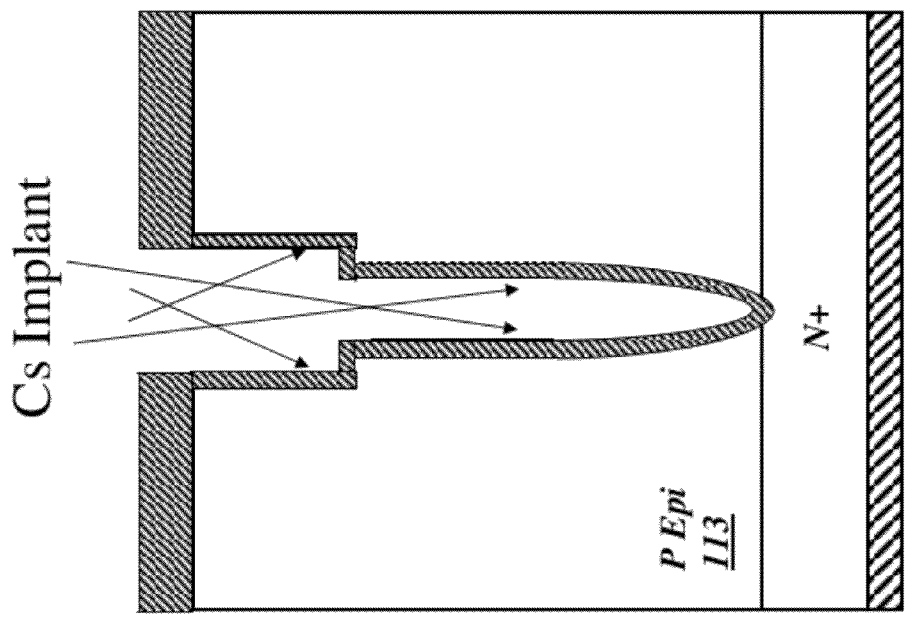

Cesium ions are now implanted into the sidewalls of the both the upper and lower trenches, as shown in FIG. 27(e), to create permanent charge near the sidewalls of these trenches. It is important to note that a photoresist mask can be optionally used to protect certain areas of the device such as termination from being implanted by Cesium.

Alternatively, it is also contemplated that a plasma immersion implant process can be used, in addition to or instead of a conventional implanter, to form these permanent charge densities.

Next, as shown in FIG. 27(f), an oxide deposition process (such as PE-TEOS or LTO) is used to close the top surface of the bottom trench without filling it up. The depth and width of the bottom trench as well as its profile can be adjusted to form empty space zone with a desired width and height. Note that a high aspect ratio trench profile is particularly advantageous for fast closing of the bottom trench's opening. In addition, for a fixed trench depth and width, the oxide deposition process conditions can be tuned differently for producing different empty space zone size.

After forming the empty space zone, a bottom-up filling technique, such as HDP, can be employed to completely fill up the upper wide trench with an insulator (such as oxide), followed by a planarization process (such as CMP). This results in the structure shown in FIG. 27(g)).

Figure 27H:
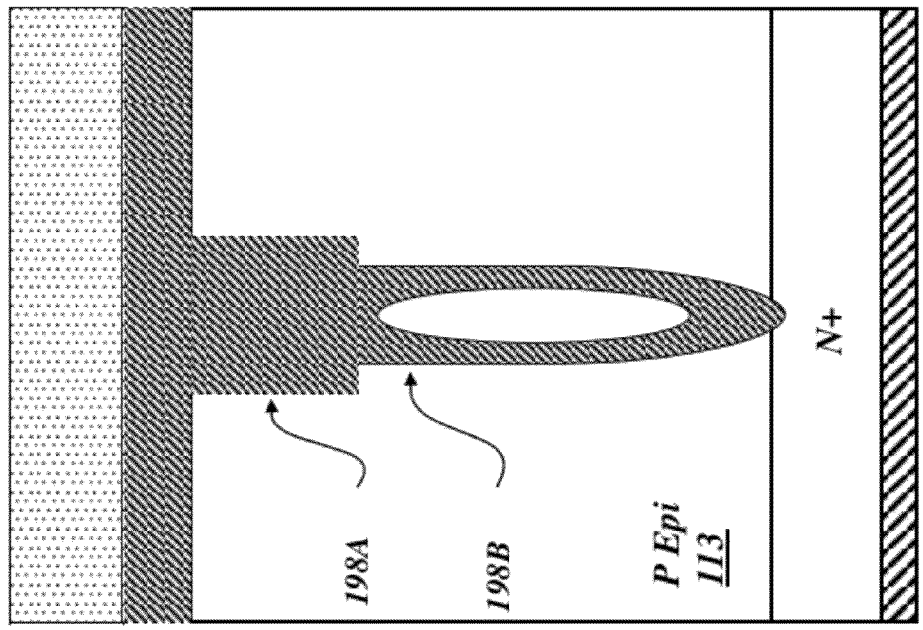
Figure 27G:
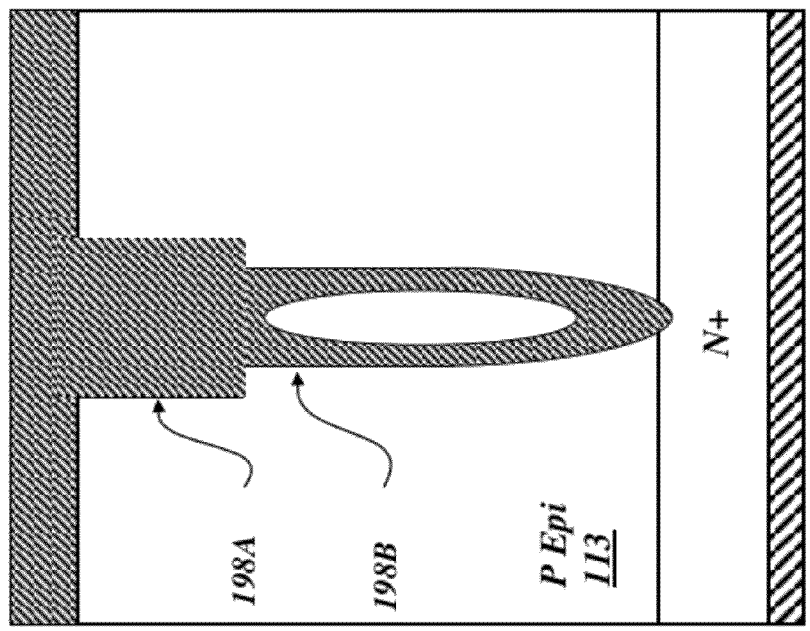

Polysilicon or the like is now deposited uniformly over the surface of the wafer, and a thermal or RTA anneal step is performed to activate the implanted cesium ions (or other species, if used for permanent charge), as shown in FIG. 27(h).

Figure 27I:
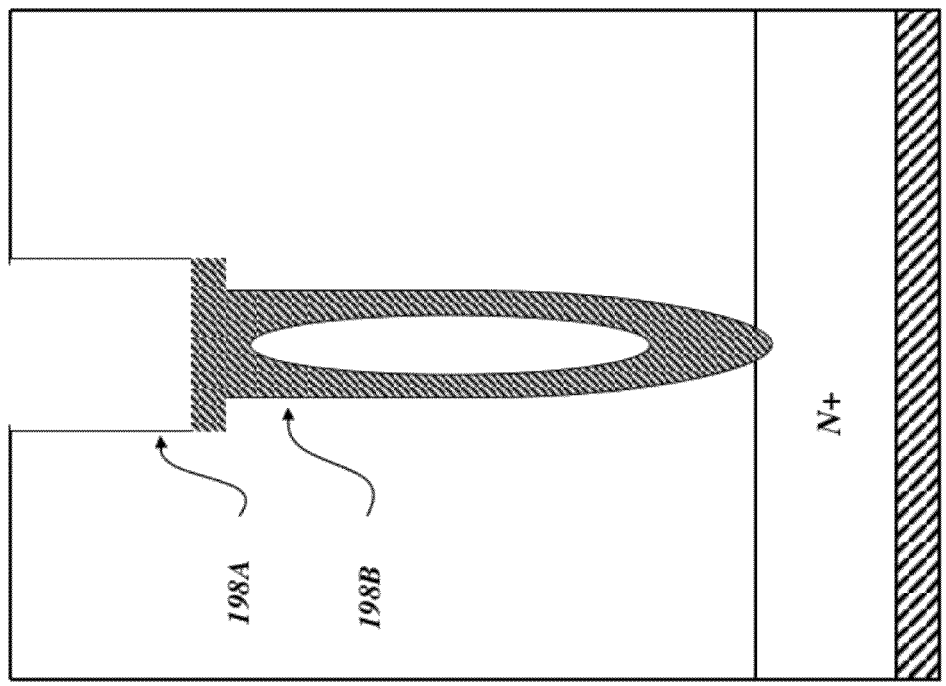

A normal oxide etch, perpendicular to the surface, is then used to etch back the oxide surface, and to clear the trench down to a desired depth as depicted in FIG. 27(i). This step opens up the active gate trench region.

Figure 27J:
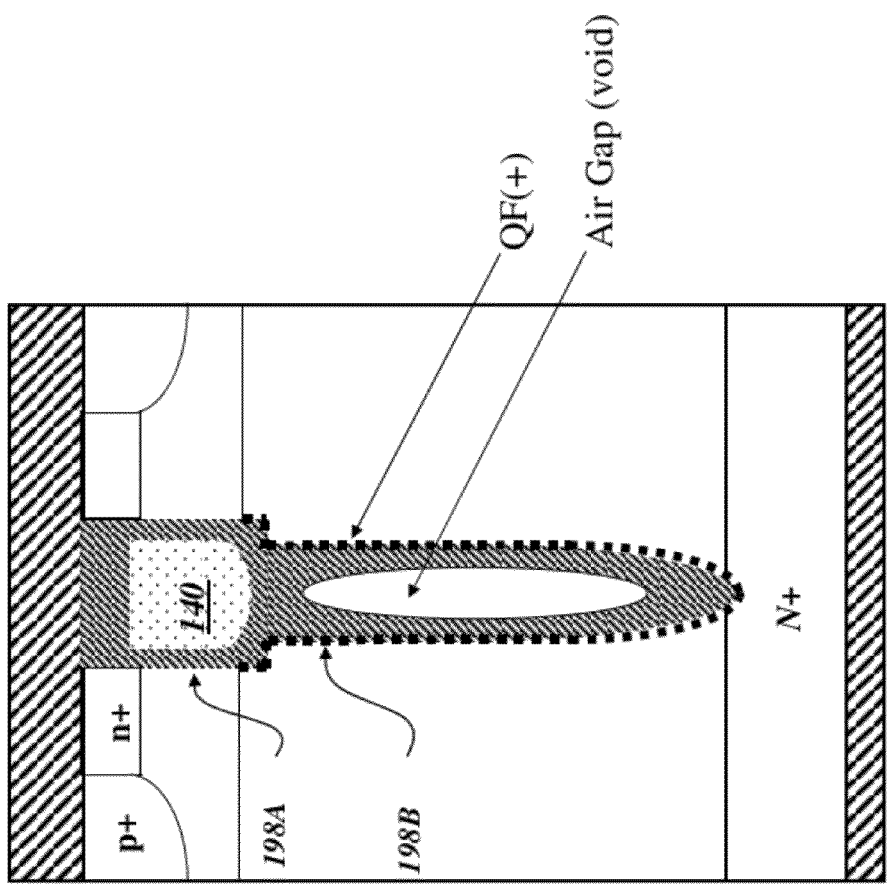

Starting with this process step, a standard fabrication process of trench MOSFET is employed to produce the final device structure shown in FIG. 27(j).

Figure 28B:
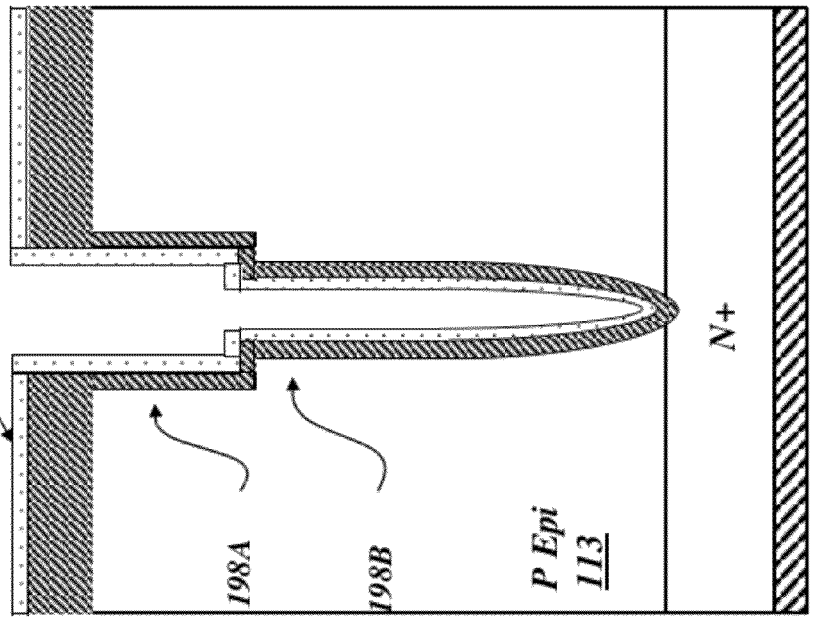
FIGS. 28(a)-28(d) show a variation in the fabrication method of FIGS. 27(a)-27(j).
Figure 28A:
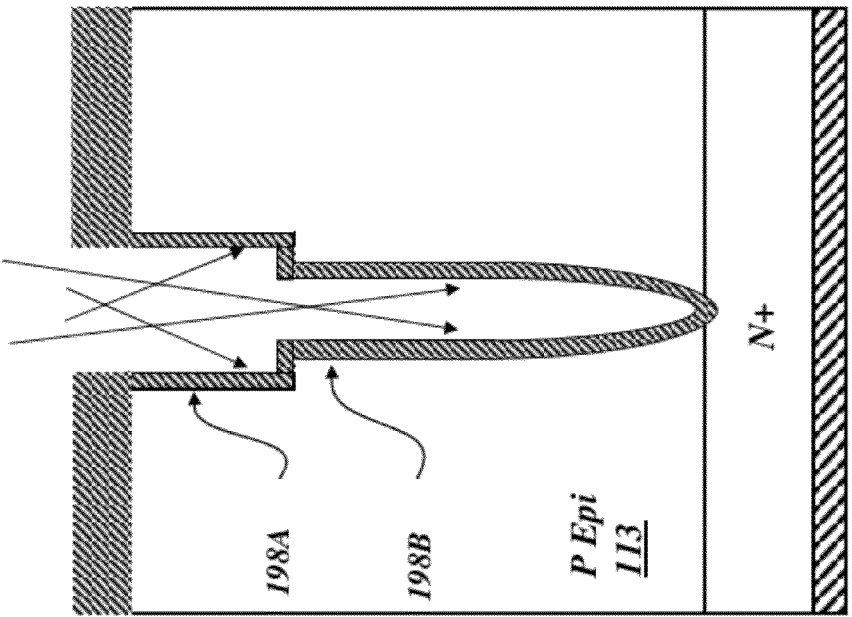
Figure 28D:
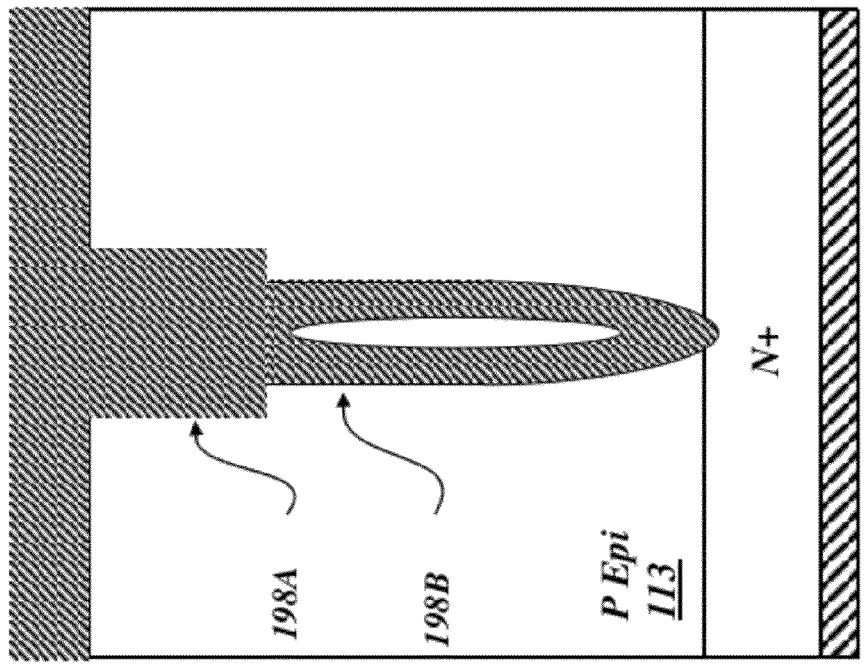
Figure 28C:
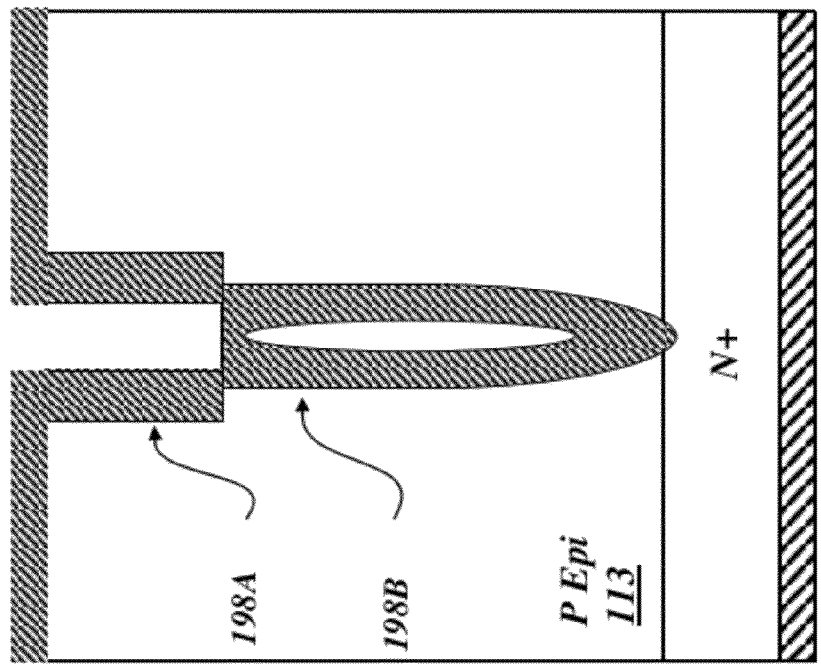

FIGS. 28(a)-28(d) show a variation in the fabrication method of FIGS. 27(a)-27(j). As shown in FIG. 28(b), a polysilicon layer is deposited and used as barrier after the Cs implant.

The device is then annealed, and the polysilicon layer is then fully oxidized. The subsequent processing steps are similar to those of FIG. 27(b) and the figures which follow it.

Figure 29B:
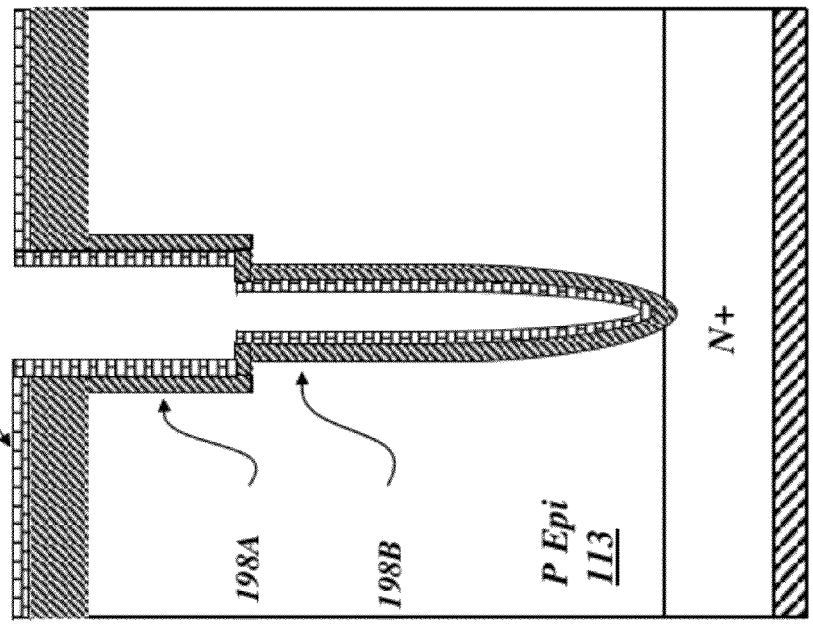
FIGS. 29(a)-29(b) show yet another variation in the fabrication method of FIG. 27(a)-27(j).
Figure 29A:
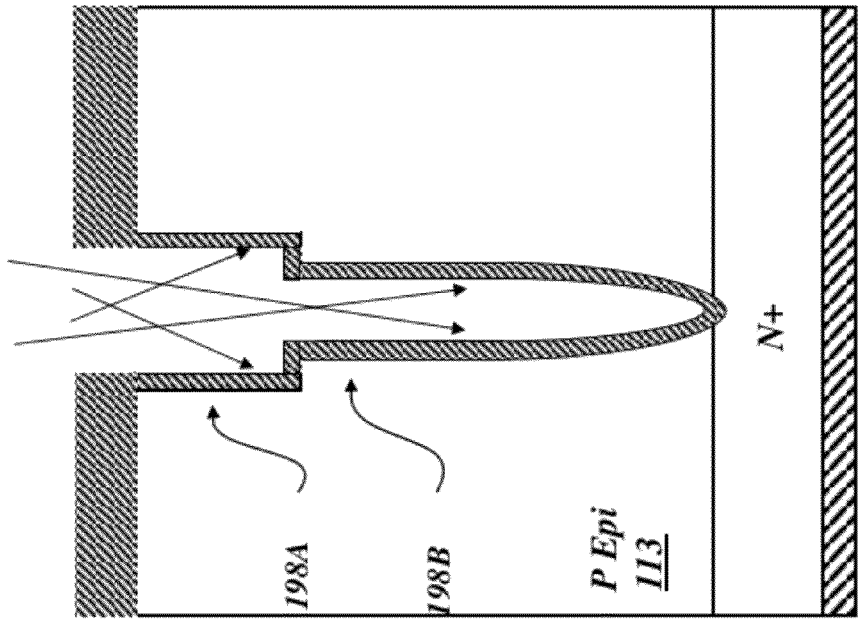

FIGS. 29(a)-29(b) show yet another variation in the fabrication method of FIG. 27(a)-27(j). In this example, a nitride layer (SiN) is used as a barrier after Cs implant.

The device is then annealed and the nitride layer is etched. The subsequent processing steps are similar to those of FIG. 27(c) and the figures which follow it.

In order to verify the proposed concept two dimensional device simulations have been performed to study the characteristics of the new device. The simulated breakdown voltage of 120V and $R_{sp}$ of 0.4 mohm-cm² for a 2.2 micron cell pitch device are shown in FIG. 30. The potential contours of the device in the off-state with a drain voltage of 120V are shown in FIG. 31.

According to various disclosed embodiments, there is provided: A semiconductor device, comprising: at least one current-controlling structure, including a predominantly vertical channel region, and a gate which lies predominantly inside a first trench; a drift region, into which majority carriers injected from said current-controlling structure flow when said current-controlling structure is in the ON state; one or more insulated empty space zone-filled regions located within said first trench, in proximity to respective portions of said drift region; and a drain, into which majority carriers flow from said drift region when said current-controlling structure is in the ON state.

According to various disclosed embodiments, there is also provided: A semiconductor device, comprising: a first-conductivity-type semiconductor source; a second-conductivity-type semiconductor body region, which separates said source from a semiconductor drift region; a gate, located in a trench in said body region, which is capacitively coupled to a nearby portion of said body region to control formation of a channel therein; and an insulated empty space zone region, also located in said trench in proximity to at least part of said drift region; whereby capacitive coupling to said drift region is reduced by the lower parasitic capacitance of said empty space zone region.

According to various disclosed embodiments, there is provided: A semiconductor device, comprising: a first-conductivity-type semiconductor source; a second-conductivity-type semiconductor body region, which vertically separates said source from a semiconductor drift region; a gate, located in a first part of a trench, which is capacitively coupled to a nearby portion of said body region to control formation of a channel therein; an insulated empty space zone region, located in a second part of said trench, beneath said gate, in proximity to at least part of said drift region; wherein said second part of said trench is narrower than said first part of said trench; permanent electrostatic charge in proximity to the interface between said second part of said trench and said drift region; and a first-conductivity-type drain region below said drift region; whereby capacitive coupling to said drift region is reduced by the lower parasitic capacitance of said empty space zone region.

According to various disclosed embodiments, there is provided: A power semiconductor device, comprising: at least one current-controlling structure, which injects majority carriers into a drift region; and wherein majority carriers injected from said current-controlling structure flow through said drift region in a generally lateral direction to a drain; and one or more insulated empty space zone-filled regions located within said drift region; wherein said drain is laterally spaced from said current-controlling structure, and generally does not lie beneath said current-controlling structure.

According to various disclosed embodiments, there is provided: A method for operating a power semiconductor device, comprising the actions of: interruptably controlling current with at least one current-controlling structure, including a predominantly vertical channel region, and a gate which lies predominantly inside a first trench; wherein majority carriers are injected into a drift region from said current-controlling structure flow when said current-controlling structure is in the ON state; and confining carrier flow within said drift region by means of one or more insulated empty space zone-filled regions located within said first trench, in proximity to respective portions of said drift region; wherein majority carriers flow from said drift region into a drain when said current-controlling structure is in the ON state.

According to various disclosed embodiments, there is provided: A method for operating a power semiconductor device, comprising the actions of: controllably applying voltage to a gate electrode which is located in a trench in a semiconducting body region, to thereby control formation of a channel in a portion of said body region which is near said gate electrode; wherein majority carriers flow from a semiconductor source region through said channel into a drift region, when said channel is present, and thence to a drain region; wherein said source region is a first-conductivity-type semiconducting material, and said body is a second-conductivity-type semiconducting material; and confining carrier flow within said drift region by means of one or more insulated empty space zone-filled regions located within said first trench, in proximity to respective portions of said drift region; whereby capacitive coupling to said drift region is reduced by the lower parasitic capacitance of said empty space zone region.

According to various disclosed embodiments, there is provided: A method for operating a power semiconductor device, comprising the actions of: controllably applying voltage to a gate electrode which is located in a trench in a semiconducting body region, to thereby control formation of a channel in a portion of said body region which is near said gate electrode; wherein majority carriers flow from a semiconductor source region through said channel into a drift region, when said channel is present, and thence to a drain region; wherein said source region is a first-conductivity-type semiconducting material, and said body is a second-conductivity-type semiconducting material; confining carrier flow within said drift region by means of one or more insulated empty space zone-filled regions located within said first trench, in proximity to respective portions of said drift region; and altering the density of majority carriers within at least part of said drift region by using permanent electrostatic charge near sidewalls of said trench.

According to various disclosed embodiments, there is provided: A method for operating a power semiconductor device, comprising the actions of: controllably applying voltage to a gate electrode which is capacitively coupled to a portion of a semiconducting body region, to thereby control formation of a channel in a portion of said body region which is near said gate electrode; wherein majority carriers flow from a semiconductor source region through said channel into a drift region, when said channel is present, and thence laterally to a drain region; wherein said source region is a first-conductivity-type semiconducting material, and said body is a second-conductivity-type semiconducting material; confining carrier flow within said drift region by means of one or more insulated empty space zone-filled regions located within said first trench, in proximity to respective portions of said drift region; and wherein said drain is laterally spaced from said current-controlling structure, and generally does not lie beneath said current-controlling structure.

According to various disclosed embodiments, there is provided: A method for fabricating a power semiconductor device, comprising the actions of, in any order: Etching a first trench portion into a semiconductor material, and forming spacers on sidewalls of said first trench portion; Etching further into said semiconductor material to form second trench portions within ones of said first trenches; reacting said semiconductor material within said trenches, where not covered by said spacers, to thereby close off said second portions while leaving a void therein; and forming a gate, within said first trench portion, which is capacitively coupled to an adjacent semiconductor region to induce partial inversion thereof in dependence on voltage applied to said gate; and forming semiconductor source, drift, and drain regions, with at least part of said drift region being adjacent to said second trench portion.

According to various disclosed embodiments, there is provided: Power semiconductor devices in which insulated empty space zones are used for field-shaping regions, in place of dielectric bodies previously used. Optionally permanent charge is added at the interface between the insulated empty space zone and an adjacent semiconductor drift region.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are realizable with this application simply by changing the polarity of the permanent charge and swapping n-type and p-type regions in any of the figures. This is well known by those of ordinary skill in the art.

It should be noted in the above drawings the positive and permanent charge was drawn for illustration purpose only. It is understood that the charge can be in the dielectric (oxide), at the interface between the silicon and oxide, inside the silicon layer, or a combination of all these cases.

It is also understood that numerous combinations of the above embodiments can be realized.

For example, the disclosed inventions are not applicable only to unipolar devices. In other classes of embodiments hybrid devices, such as IGBT-type bipolar devices, which include drift geometries analogous to those described above.

For another example, the disclosed inventions can also be applied, with appropriate adaptations, to edge termination structure.

Although the preferred embodiments are fabricated in a silicon wafer, it is alternatively possible to use other semiconductor materials. One example is SiGeC, but other compound semiconductors are also possible, as well as other semiconductor materials.

By comparing FIGS. 2c and 2d, it can be seen that the fraction of silicon area occupied by nonconductive trench is reduced when the bottom trench is narrowed. This desirably increases the available cross-section of the drift zone.

Depending on the process conditions used to close the lower trench, the volumetric ratio of the empty space zone to the enclosure oxide can vary up to more than half. Higher ratios will decrease the dielectric coupling seen by carriers in the on-state, but are limited by the need for a sufficiently predictable closure to not have problems during etchback of the refilled trench in FIG. 7(g). Note that the pad oxide deposition of FIG. 7(d) can help assure a minimum amount of grown oxide on the trench sidewalls.

Figure 7B:
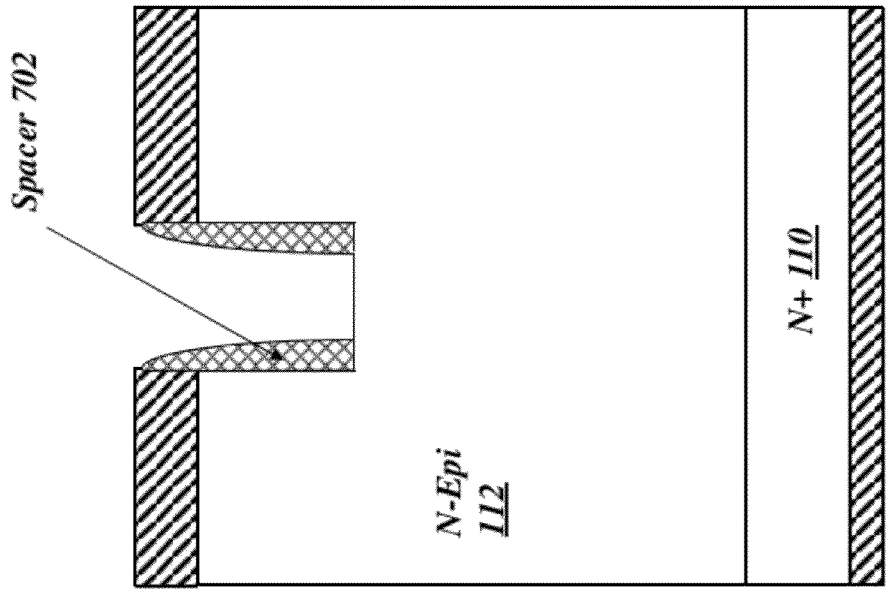
FIGS. 7(a) to 7(h) show a sample fabrication process.
Figure 7A:
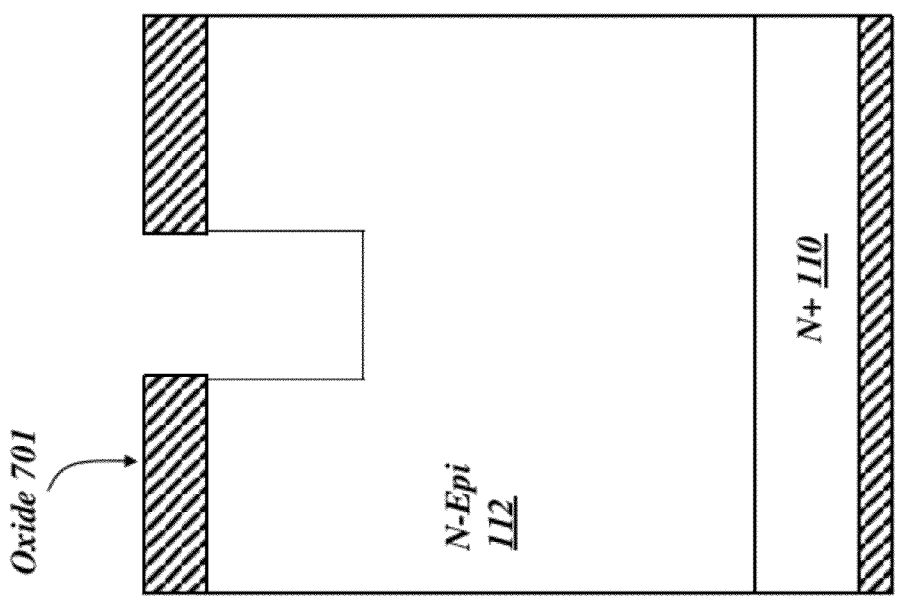
Figures 7C, 7D:
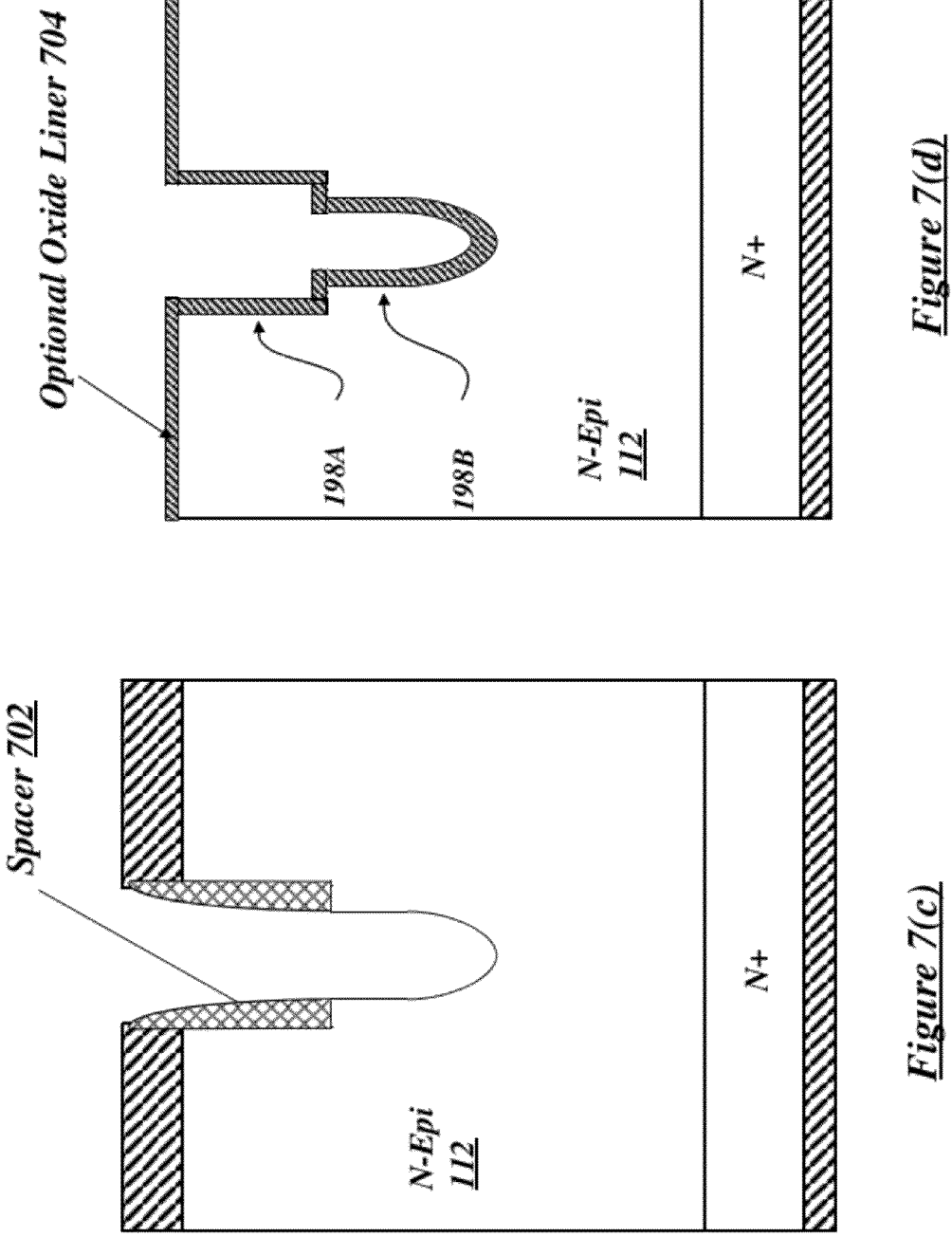
Figure 7E:
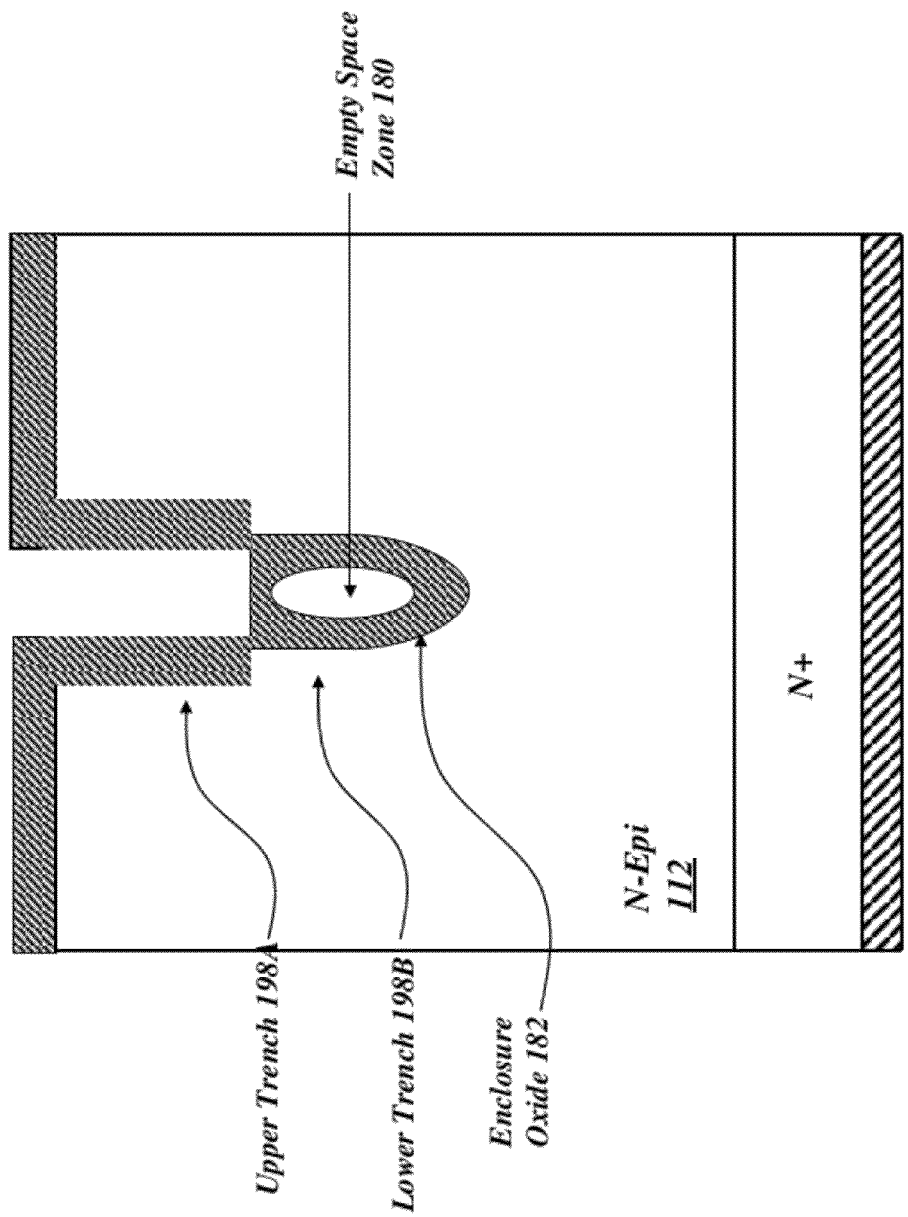
Figure 7G:
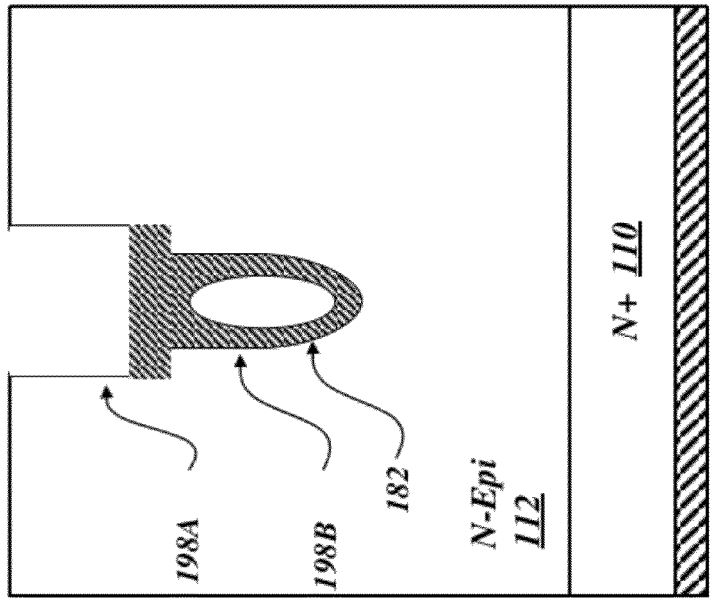
Figure 7F:
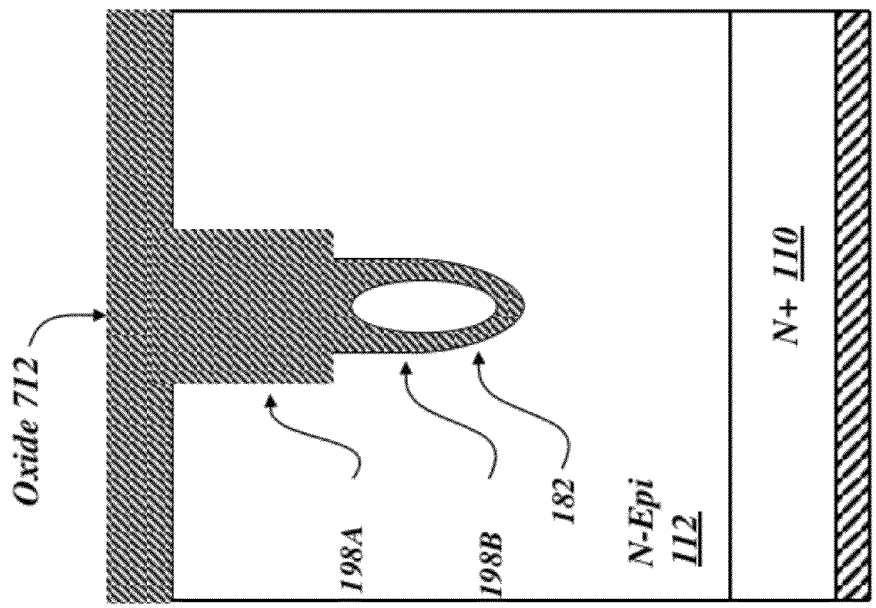
Figure 7H:
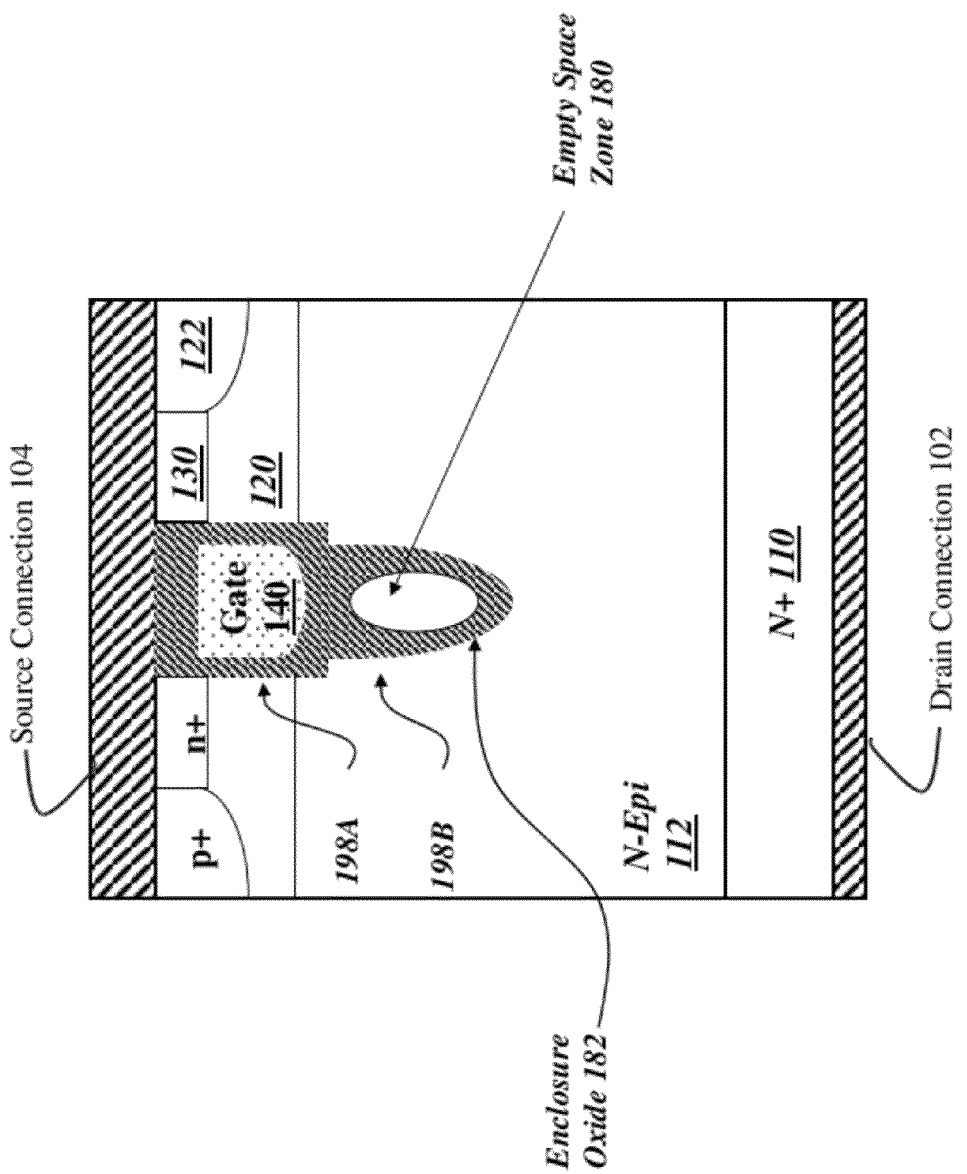

Another possible modification is to etch stop over the bottom trench at FIG. 7(e). For example, a thin conformal nitride or oxynitride layer can provide additional reliability in the etchback of FIG. 7(g). The geometry shown in FIG. 7(e) would not allow such an etch stop to cover the bottom trench, but this is dependent on the ratio of widths and the conditions of the oxidation which closes the bottom trench. Even if the etch stop covered the void but not the entire trench width, that still can provide partial protection.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device, comprising:
   at least one current-controlling structure, including a predominantly vertical channel region, and a gate which lies predominantly inside a first trench;
   a drift region, into which majority carriers injected from said current-controlling structure flow when said current-controlling structure is in the ON state;
   one or more insulated empty space zone-filled regions located within said first trench, in proximity to respective portions of said drift region; and
   a drain, into which majority carriers flow from said drift region when said current-controlling structure is in the ON state;
   wherein permanent electrostatic charge is located in proximity to sidewalls of said trench, to thereby apply a permanent electric field to said drift region near said trench.

2. The device of claim 1, wherein said gate lies entirely inside said trench.

3. The device of claim 1, wherein permanent electrostatic charge is located in proximity to at least one sidewall of said trench, to thereby cause inversion of a layer of said drift region near said sidewall of said trench, and thereby provide an induced drain extension region within said drift region.

4. The device of claim 1, further comprising a second trench which contains a field plate, but does not contain any gate electrode.

5. The device of claim 1, wherein said drift region and said drain region have different conductivity types.

6. The device of claim 1, wherein said drift region is doped p-type, and said majority carriers are electrons.

7. The device of claim 1, wherein said current-controlling structure comprises a first-conductivity-type source and a second-conductivity type body, and wherein said gate is positioned to controllably invert part of said body to form said channel therein.

8. The device of claim 1, wherein said drift region and said drain are formed in silicon.

9. A semiconductor device, comprising:
   a first-conductivity-type semiconductor source;
   a second-conductivity-type semiconductor body region, which separates said source from a semiconductor drift region;
   a gate, located in a trench in said body region, which is capacitively coupled to a nearby portion of said body region to control formation of a channel therein; and
   an insulated empty space zone region, also located in said trench in proximity to at least part of said drift region;
   whereby capacitive coupling to said drift region is reduced by the lower parasitic capacitance of said empty space zone region;
   and further comprising permanent electrostatic charges located in proximity to sidewalls of said trench.

10. The device of claim 9, wherein said gate lies entirely inside said trench.

11. The device of claim 9, further comprising a second trench which contains a field plate, but does not contain any gate electrode.

12. The device of claim 9, wherein said drift region and said body region are both doped p-type.

13. A semiconductor device, comprising:
   a first-conductivity-type semiconductor source;
   a second-conductivity-type semiconductor body region, which vertically separates said source from a semiconductor drift region;
   a gate, located in a first part of a trench, which is capacitively coupled to a nearby portion of said body region to control formation of a channel therein;
   an insulated empty space zone region, located in a second part of said trench, beneath said gate, in proximity to at least part of said drift region; wherein said second part of said trench is narrower than said first part of said trench;
   permanent electrostatic charge in proximity to an interface between said second part of said trench and said drift region; and
   a first-conductivity-type drain region below said drift region;
   whereby capacitive coupling to said drift region is reduced by the lower parasitic capacitance of said empty space zone region.

14. The device of claim 13, wherein said permanent electrostatic charge is present in proximity to vertical sidewalls of said second part of said trench, and not in proximity to vertical sidewalls of said first part of said trench.

15. The device of claim 13, wherein said gate lies entirely inside said first part of said trench.

16. The device of claim 13, further comprising an additional trench which contains a field plate, but does not contain any gate electrode.

17. The device of claim 13, wherein said drift region and said drain region have different conductivity types.

18. The device of claim 13, wherein majority carrier flow passes through said drift region to said drain region in a predominantly vertical direction.

* * * * *